(12) United States Patent
Park et al.

(10) Patent No.: US 12,087,781 B2
(45) Date of Patent: Sep. 10, 2024

(54) IMAGE SENSOR HAVING P-TYPE ISOLATION STRUCTURE

(71) Applicant: SK hynix Inc., Icheon-si (KR)

(72) Inventors: Sung-Kun Park, Sejong-si (KR); Sun-Ho Oh, Icheon-si (KR); Kyoung-In Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 689 days.

(21) Appl. No.: 16/522,472

(22) Filed: Jul. 25, 2019

(65) Prior Publication Data

US 2020/0091212 A1   Mar. 19, 2020

(30) Foreign Application Priority Data

Sep. 17, 2018   (KR) .................. 10-2018-0110840

(51) Int. Cl.
*H01L 27/146* (2006.01)

(52) U.S. Cl.
CPC .. *H01L 27/14603* (2013.01); *H01L 27/14612* (2013.01); *H01L 27/1463* (2013.01)

(58) Field of Classification Search
CPC ......... H01L 27/14603; H01L 27/14612; H01L 27/1463; H01L 27/1464; H01L 27/14641; H01L 27/14643; H01L 27/148; H01L 27/14806; H01L 27/14616; H01L 27/14636
See application file for complete search history.

(56) References Cited

U.S. PATENT DOCUMENTS

| | | | |
|---|---|---|---|
| 9,673,245 B2 | 6/2017 | Kao et al. | |
| 2005/0093036 A1 | 5/2005 | Han | |
| 2005/0133825 A1 | 6/2005 | Rhodes et al. | |
| 2006/0145215 A1 | 7/2006 | Paik et al. | |
| 2013/0320407 A1* | 12/2013 | Ahn | H01L 31/02 257/239 |
| 2017/0040364 A1 | 2/2017 | Oh et al. | |
| 2018/0190699 A1 | 7/2018 | Lee et al. | |
| 2021/0082974 A1* | 3/2021 | Uchida | H01L 27/14621 |

FOREIGN PATENT DOCUMENTS

| | | |
|---|---|---|
| CN | 101211947 A | 7/2008 |
| CN | 101292355 A | 10/2008 |
| CN | 101552282 A | 10/2009 |
| CN | 102208420 A | 10/2011 |

(Continued)

OTHER PUBLICATIONS

Choi, S. H. et al., A novel pixel design with hybrid type isolation scheme for low dark current in CMOS image sensor, Proc. of SPIE, vol. 8659, pp. 1-8 (2013).

*Primary Examiner* — Benjamin Tzu-Hung Liu
(74) *Attorney, Agent, or Firm* — Perkins Coie LLP

(57) ABSTRACT

An image sensor includes a first active region including a first floating diffusion region, a first transistor active region, and a first isolation structure for electrically isolating the first floating diffusion region from the first transistor active region, wherein the first isolation structure comprises a first P-type doped region disposed on one corner of the first active region and a second P-type doped region disposed in a center of the first active region, the first P-typed doped region and the second P-type doped region being electrically coupled to each other.

20 Claims, 17 Drawing Sheets

(56) References Cited

FOREIGN PATENT DOCUMENTS

| | | | |
|---|---|---|---|
| CN | 103456749 | A | 12/2013 |
| CN | 205159323 | U | 4/2016 |
| JP | 2008-166780 | A | 7/2008 |
| JP | 2019145544 | A * | 8/2019 |
| KR | 10-2017-0018206 | A | 2/2017 |
| KR | 10-2018-0080469 | A | 7/2018 |

* cited by examiner

IMAGE SENSOR HAVING P-TYPE ISOLATION STRUCTURE

CROSS-REFERENCE TO RELATED APPLICATION

This patent document claims priority under 35 U.S.C. § 119 to Korean Patent Application No. 10-2018-0110840 filed on Sep. 17, 2018, which is incorporated herein by reference in its entirety.

TECHNICAL FIELD

The technology and implementations disclosed in this patent document relate to an image sensor having an isolation structure in an active region.

BACKGROUND

With the recent development of information communication industry and the digitalization of electronic devices, enhanced image sensors are used in various fields such as a digital camera, camcorder, mobile phone, personal communication system (PCS), game machine, security camera and medical micro-camera.

SUMMARY

Various embodiments of the disclosed technology are directed to an image sensor capable of reducing a dark current. In some implementations, various embodiments of the disclosed technology are directed to an image sensor in which active regions are electrically and geometrically isolated through a P-type ion implantation region without using a trench isolation region.

In one aspect, an image sensor may include a first active region including a first floating diffusion region, a first transistor active region, and a first isolation structure for electrically isolating the first floating diffusion region from the first transistor active region, wherein the first isolation structure comprises a first P-type doped region disposed on one corner of the first active region and a second P-type doped region disposed in a center of the first active region, the first P-typed doped region and the second P-type doped region being electrically coupled to each other.

In some implementations, the first transistor active region may include a channel region, a drain region and a source region of a first drive transistor; and a channel region and a source region of a first select transistor.

In some implementations, the second P-typed doped region may abut the first floating diffusion region, the drain region and the source region of the first drive transistor, and the source region of the first select transistor.

In some implementations, the second P-typed doped region may be surrounded by the first floating diffusion region, the channel region, the drain region and the source region of the first drive transistor, the channel region and the source region of the first select transistor, and the first P-typed doped region.

In some implementations, the first isolation structure may further comprise a third P-type doped region which is electrically coupled to the second P-type doped region, and the third P-type doped region is disposed between the first floating diffusion region and the first transistor active region.

In some implementations, the image sensor may further include second to fourth active regions disposed in different locations relative to the first active region, each of the second to fourth active regions includes a corresponding floating diffusion region, a corresponding transistor active region, and a corresponding isolation structure for electrically isolating the corresponding floating diffusion region from the corresponding transistor active region.

In some implementations, one of transistor active regions of the second and third transistor active regions may include a channel region, a drain region and a source region of a corresponding drive transistor; and a channel region and a source region of a corresponding select transistor.

In some implementations, the second and third center isolation regions may abut the second and third floating diffusion regions, the drain regions and source regions of the second and third drive transistors, and the source regions of the second and third select transistors, respectively.

In some implementations, one of isolation structures of the second and the third transistor active regions may include a doped region located relative to the corresponding floating diffusion region and abutting the corresponding floating diffusion region, the drain region and the source region of the corresponding drive transistor, and the source region of the corresponding select transistor.

In some implementations, one of isolation structures of the second and the third transistor active regions may include a doped region located relative to the corresponding floating diffusion regions and surrounded by the corresponding floating diffusion regions, the channel region, the drain region and the source region of the corresponding drive transistor, and the channel region and the source region of the corresponding select transistors.

In some implementations, the fourth transistor active region may include a channel region, a drain region and a source region of a reset transistor.

In some implementations, an isolation structure of the fourth transistor active region may include a doped region located relative to the corresponding floating diffusion region and abutting the corresponding floating diffusion region the drain region and the source region of the reset transistor.

In some implementations, the doped region of the isolation structure of the fourth transistor active region may be surrounded by the corresponding floating diffusion region, the channel region, and the drain region and the source region of the reset transistor.

In some implementations, the first active region may further include a first transfer transistor region disposed between the first floating diffusion region and the first P-typed doped region.

In another aspect, an image sensor may include first to fourth active regions comprising first to fourth floating diffusion regions, first to fourth transistor active regions, and first to fourth isolation structures, the first to fourth floating diffusion region being electrically isolated from the first to fourth transistor active regions, respectively, by a corresponding one of the first to fourth P-type isolation structures, wherein one of the first to third transistor active regions comprises one of drain regions and one of source regions of a corresponding one of first to third drive transistors and one of source regions of a corresponding one of first to third select transistors, and the fourth transistor active region comprises a drain region and a source region of a reset transistor.

In some implementations, one of the first to fourth P-type isolation structures may include a first doped region disposed on one corner of a corresponding one of the first to fourth active regions and a second doped region disposed in a center of the corresponding one of the first to fourth active regions, the first doped region and the second doped region electrically coupled each other.

In some implementations, the first doped region of the one of the first to fourth P-type isolation structures may abut the one of the source regions of the corresponding one of the first to third select transistors, and the second doped region of the one of the first to fourth P-type isolation structure abuts the drain region of the reset transistor.

In some implementations, one of the first to fourth P-type isolation structures may further include a third doped region which abuts the second doped region of the one of the first to fourth center isolation regions and a corresponding side of the first to fourth active regions.

In some implementations, the third doped region may be disposed between a corresponding one of the first to third floating diffusion regions and the drain regions of the corresponding one of the first to third drive transistors, or the third doped region may be disposed between the fourth floating diffusion region and the source region of the reset transistor.

In some implementations, one of the first to third transistor active regions may further include a channel region of the corresponding one of the first to third drive transistors and a channel region of the corresponding one of the first to third select transistors, and the fourth transistor active region further comprises a channel region of the reset transistor.

In some implementations, the channel region of the corresponding one of the first to third drive transistors, the channel region of the corresponding one of the first to third select transistors, and a corresponding one of the first to third floating diffusion regions may be disposed on corners of the one of the first to third active regions, respectively, and the channel region and drain region of the reset transistor and the fourth floating diffusion region may be disposed on corners of the fourth active region, respectively.

In accordance with various embodiments of the disclosed technology, the image sensor may include the P-type isolation structure for electrically and geometrically isolating the active regions. Thus, the trench isolation regions may be replaced with the P-type isolation structure. Since the image sensor has the structure in which the trench isolation regions for electrically and geometrically isolating the active regions are reduced and replaced with the P-type isolation structure, a dark current at the interface can be reduced. Furthermore, since the trench isolation regions are reduced, the degree of integration of the image sensor can be improved. Other effects of the various embodiments, which are not described, will be mentioned in the detailed description.

DETAILED DESCRIPTION

Figure 1:
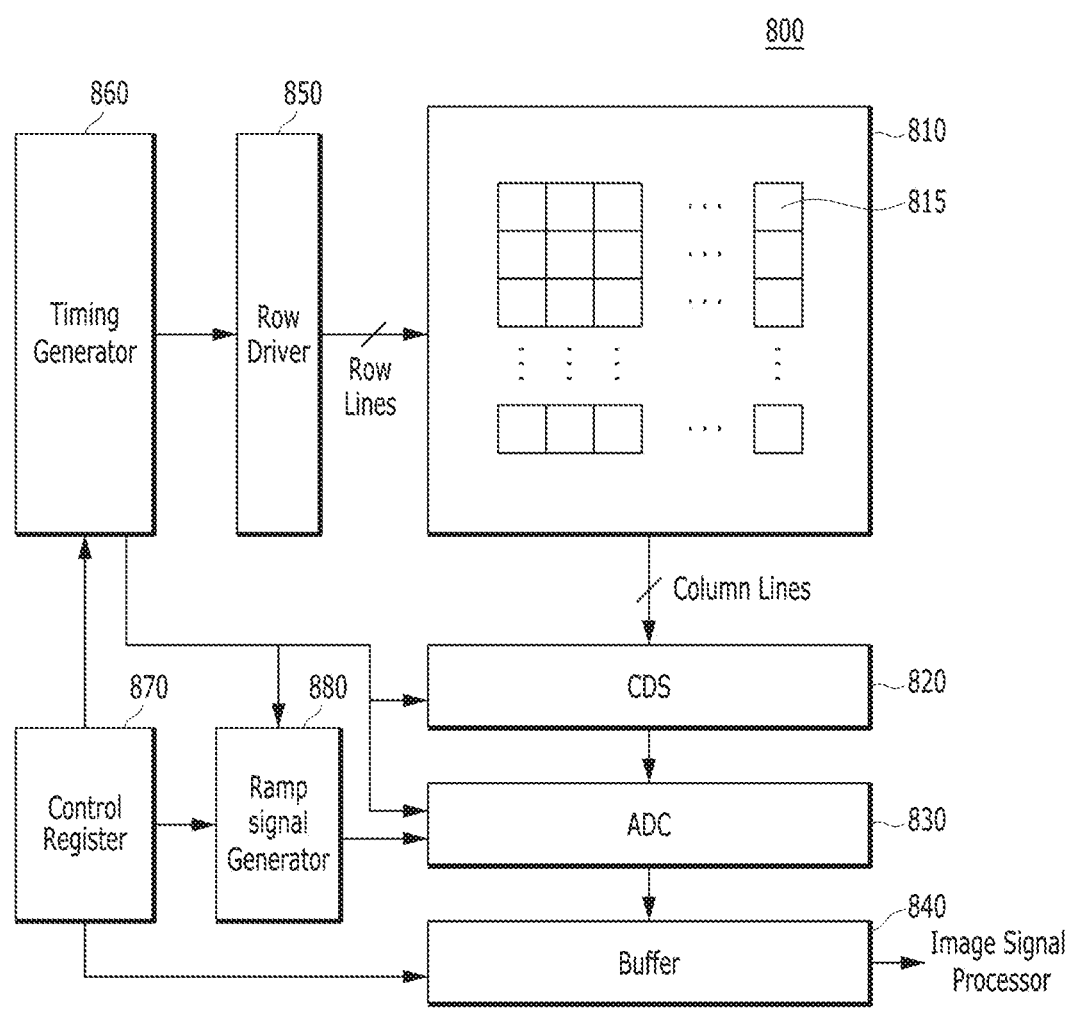
FIG. 1 is an example of a block diagram schematically illustrating an image sensor based on some implementations of the disclosed technology.

The advantages and characteristics of the present disclosure and a method for achieving the advantages and characteristics will be clarified through the following embodiments with reference to the accompanying drawings.

Throughout the specification, the same reference numerals refer to like elements. Therefore, although the same or similar reference numerals are not mentioned or described in the corresponding drawing, the reference numerals may be described with reference to other drawings.

Furthermore, although elements are not represented by reference numerals, the elements may be described with reference to other drawings.

An image sensor generally includes a pixel array and a peripheral circuit area. In the pixel array, unit pixels including photoelectric conversion elements and pixel transistors are arranged. For electrical insulation between the photoelectric conversion elements and the pixel transistors, isolation regions such as shallow trench isolation (STI) are formed. Certain c STI constructions may contribute the presence of the undesired dark current in a photoelectric conversion element in absence of incident light, including some STI structures having a dangling bond at the interface with silicon, thus leading to a small amount of the dark current.

The disclosed technology can be implemented to provide an image sensor exhibiting improved characteristics. In some implementations, the disclosed image sensor can prevent or reduce undesired characteristics such as a portion of the dark current caused by or contributed by the STI. Various implementations of the disclosed technology provide an image sensor with an isolation structure using a doped region.

FIG. 1 is an example of a block diagram schematically illustrating an image sensor 800 based on some implementations of the disclosed technology. Referring to FIG. 1, the image sensor 800 may include a pixel array 810, a correlated double sampler (CDS) 820, an analog-digital converter (ADC) 830, a buffer 840, a row driver 850, a timing generator 860, a control register 870 and a ramp signal generator 880.

The pixel array 810 may include a plurality of pixel blocks 815 arranged in a matrix structure. Each of the pixel blocks 815 may convert optical image information into an electrical image signal, and transfer the electrical image signal to the CDS 820 through column lines. Each of the pixel blocks may be coupled to one of row lines and one of the column lines.

The CDS 820 may temporarily store and sample the electrical image signal received from the pixel blocks 815 of the pixel array 810. For example, the CDS 820 may sample a reference voltage level and a voltage level of the received electrical image signal according to a clock signal provided from the timing generator 860, and transfer an analog signal corresponding to a difference therebetween to the ADC 830.

The ADC 830 may convert the received analog signal into a digital signal representing the electrical image signal from a particular pixel block 815, and transfer the digital signal to the buffer 840.

The buffer 840 may latch or hold the received digital signal, and sequentially output the latched or held signal to an external image signal processor. The buffer 840 may include a memory for latching the digital signal and a sense amplifier for amplifying the digital signal.

The row driver 850 may drive the plurality of pixel blocks 815 of the pixel array 810 according to a signal of the timing generator 860. For example, the row driver 850 may generate select signals for selecting one row line of the plurality of row lines and/or driving signals for driving one row line.

The timing generator 860 may generate a timing signal for controlling the CDS 820, the ADC 830, the row driver 850 and the ramp signal generator 880.

The control register 870 may generate control signals for controlling the buffer 840, the timing generator 860 and the ramp signal generator 880.

The ramp signal generator 880 may generate a ramp signal for controlling an image signal outputted from the buffer 840, under control of the timing generator 860.

Figure 2:
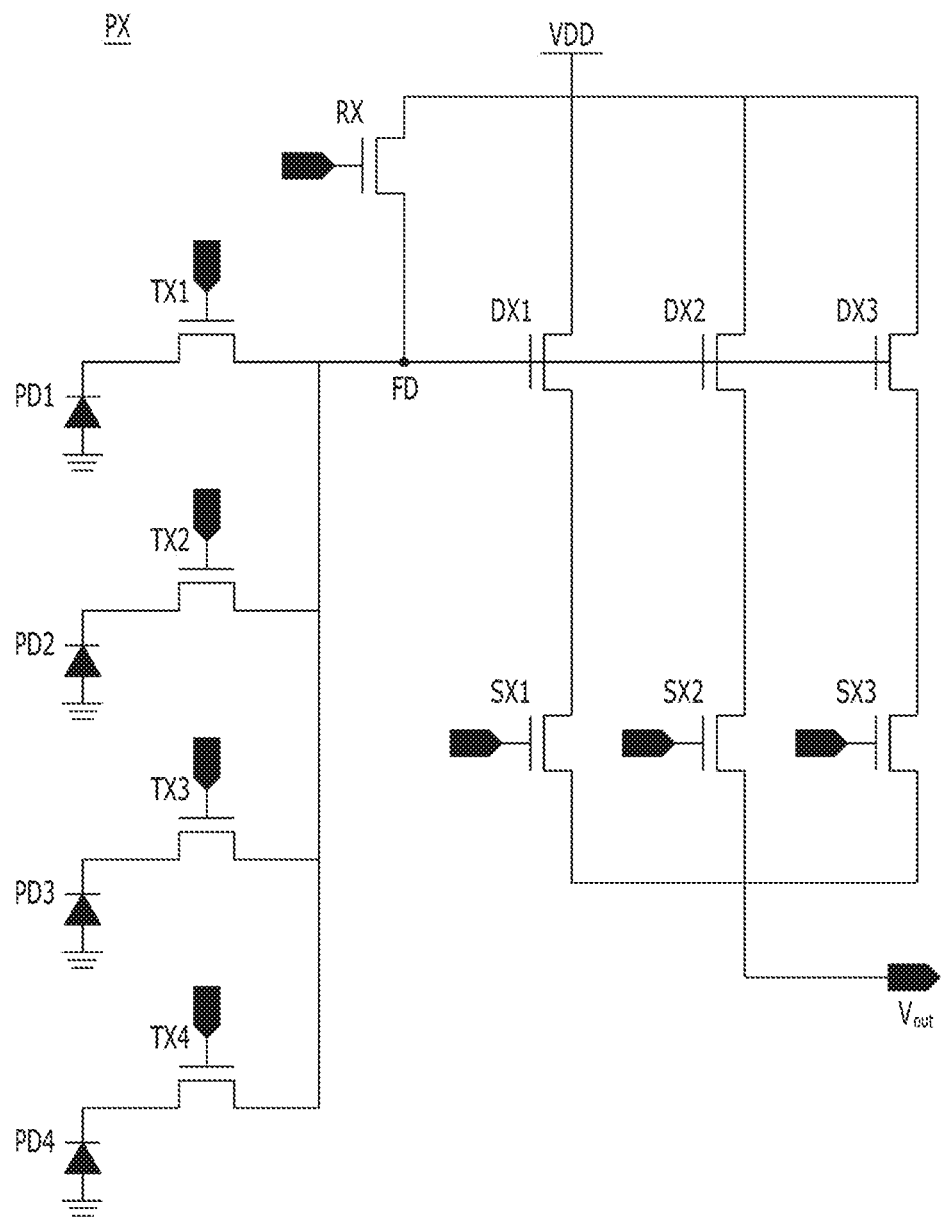
FIG. 2 is an equivalent circuit diagram of a unit pixel of an image sensor based on some implementations of the disclosed technology.

FIG. 2 is an equivalent circuit diagram of a unit pixel PX of an image sensor based on some implementations of the disclosed technology. Referring to FIG. 2, the unit pixel PX may include first to fourth photodiodes PD1 to PD4, first to fourth transfer transistors TX1 and TX4, a floating diffusion region FD, a reset transistor RX, first to third drive transistors DX1 to DX3, and first to third select transistors SX1 to SX3. Although the unit pixel PX in this specific example includes four photodiodes PD1 to PD4, one or photoelectric conversion elements may be used instead of four photodiodes and other types of optical detectors or photoelectric conversion elements may be used. For example, the photo electric conversion elements may be implanted by a photo sensing device or circuit including a photo diode, a photo transistor, a photo gate, or other photosensitive circuitry capable of converting light into a pixel signal (e.g., a charge, a voltage or a current). In this patent document, the photodiodes PD1 to PD4 are described as one example of the photoelectric conversion elements.

Each of the first to fourth photodiodes PD1 to PD4 may receive light and generate photocharges such as electron-hole pairs (EHP). As described above, the first to fourth photodiodes PD1 to PD4 may be replaced with any ones of various photoelectric conversion devices such as a photo-gate, photo-transistor, or charge-coupled device (CCD).

The first to fourth transfer transistors TX1 to TX4 may be electrically coupled to the first to fourth photodiodes PD1 to PD4, respectively. The first to fourth transfer transistors TX1 to TX4 may transfer photo-electrons generated in the first to fourth photodiodes PD1 to PD4, respectively, to the floating diffusion region FD.

The floating diffusion region FD, which receives the generated photo-electrons from the first to fourth transfer transistors TX1 to TX4, may provide the received the photo-electros to the gate electrodes of the first to third drive transistors DX1 to DX3.

The gate electrodes of the first to third drive transistors DX1 to DX3 may be electrically coupled to the floating diffusion region FD. In some implementations, the first to third drive transistors DX1 to DX3 may be coupled in parallel to each other, and enabled at the same time.

The floating diffusion region FD and the source electrode of the reset transistor RX may be electrically coupled. The drain electrode of the reset transistor RX may be electrically coupled to a supply voltage VDD.

The drain electrodes of the first to third drive transistors DX1 to DX3 may also be electrically coupled to the supply voltage VDD in common.

The source electrodes of the first to third drive transistors DX1 to DX3 may be electrically coupled to the drain electrodes of the first to third select transistors SX1 to SX3, respectively.

The gate electrodes of the first to third select transistors SX1 to SX3 may electrically coupled to each other or to a common conductive node, pad or element. The source electrodes of the first to third select transistors SX1 to SX3 may electrically coupled to an output node Vout. In some implementations, the first to third select transistors SX1 to SX3 may be coupled in parallel to each other, and enabled at the same time.

Figure 3A:
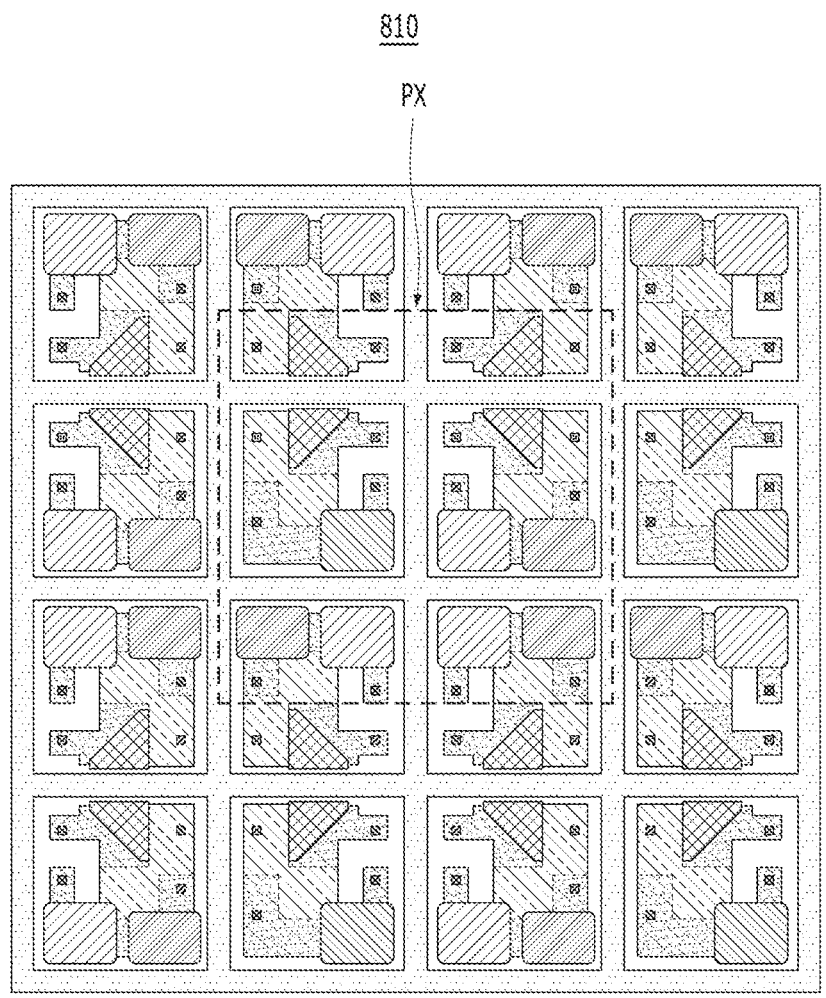
FIG. 3A illustrates an example of a schematic layout of a pixel array of the image sensor based on some implementations of the disclosed technology.
Figure 3B:
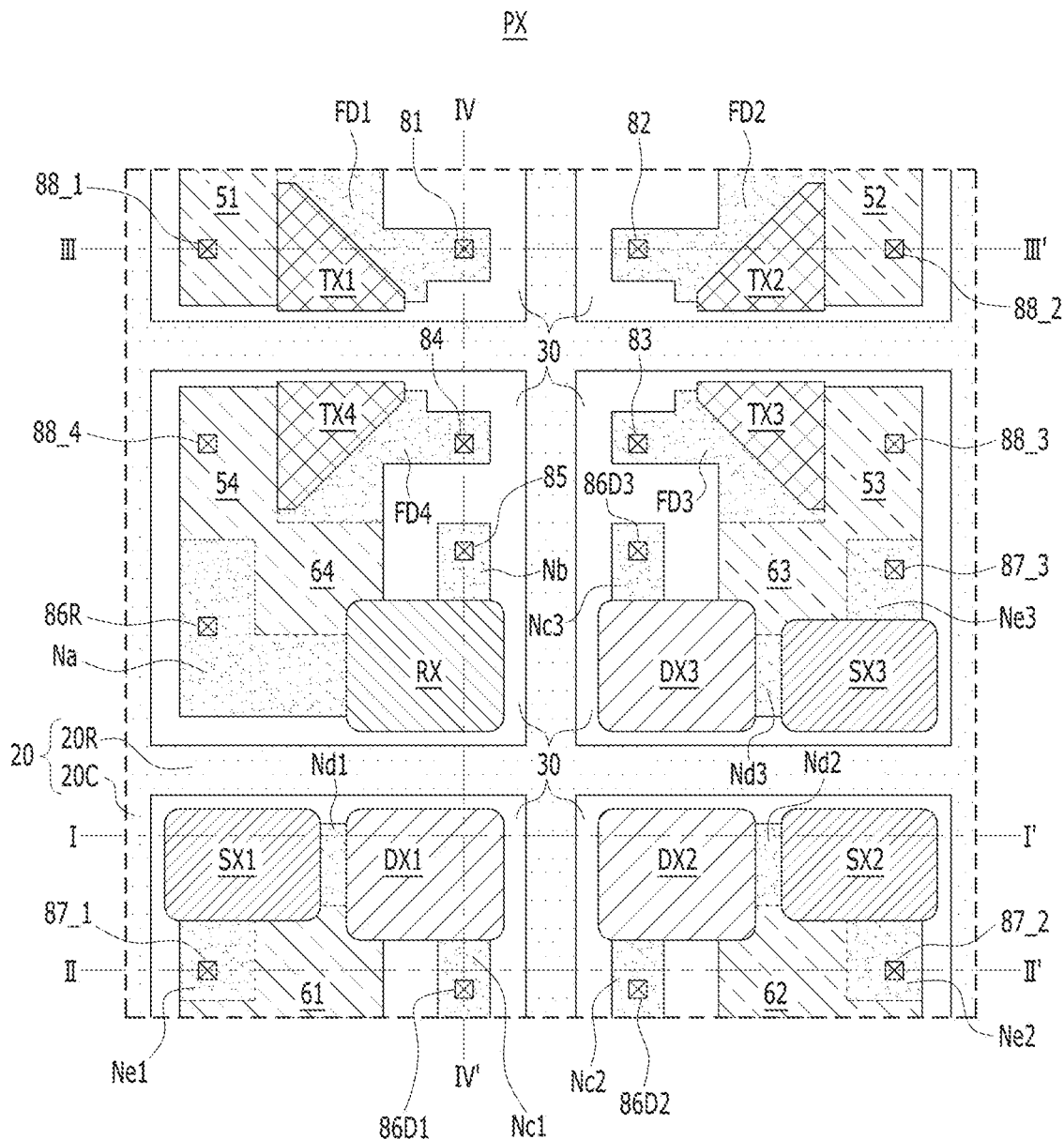
FIG. 3B is an expanded view of a unit pixel region of FIG. 3A.

FIG. 3A illustrates a schematic layout of a pixel array 810 of an image sensor 800 based on some implementations of the disclosed technology, and FIG. 3B is an expanded view of a unit pixel region PX of FIG. 3A.

Referring to FIGS. 3A and 3B, the pixel array 810 may include a deep trench isolation (DTI) regions 20, a shallow trench isolation (STI) regions 30, first to fourth floating diffusion regions FD1 to FD4, a plurality of N-type doped regions Na, Nb, Nc1 to Nc3, Nd1 to Nd3, and Ne1 to Ne3, first to fourth well-tab regions 51 to 54, first to fourth center isolation regions 61 to 64, first to fourth transfer transistors TX1 to TX4, first to third drive transistors DX1 to DX3, first to third select transistors SX1 to SX3, a reset transistor RX, and a plurality of contacts 81 to 85, 86R, 86D1 to 86D3, 87_1 to 87_3, and 88_1 to 88_6.

The DTI regions 20 may have a grid shape. For example, when seen from the top, the DTI regions 20 may include line-shaped first trench isolation regions 20R extended in a row direction and line-shaped second trench isolation regions 20C extended in a column direction, and the first and second trench isolation regions 20R and 20C may cross each other at right angles.

The STI regions 30 may be formed in a rectangular shape. The STI regions 30 may be formed in spaces defined by the DTI regions 20 and provide a plurality of active regions. The active regions may include the first to fourth floating diffusion regions FD1 to FD4, the plurality of N-type doped regions Na, Nb, Nc1 to Nc3, Nd1 to Nd3, and Ne1 to Ne3, the first to fourth well-tab regions 51 to 54, the first to fourth center isolation regions 61 to 64, and channel regions CH (refer to FIGS. 4A and 4B). The STI regions 30 may be formed on the DTI regions 20 so as to vertically overlap the DTI regions 20 based on a longitudinal cross-sectional view.

The first to fourth transfer transistors TX1 to TX4 may have various shapes. In FIG. 3B, as an example, the first to fourth transfer transistors TX1 to TX4 have a right-angled triangle shape. For example, the first to fourth transfer transistors TX1 to TX4 having a right-angled triangle shape may be radially arranged. For example, the first transfer transistor TX1 and the second transfer transistor TX2 are arranged along the row direction and the third transfer transistor TX3 and the fourth transfer transistor TX3 are arranged along the row direction. For example, the first transfer transistor TX1 and the fourth transfer transistor TX4 are arranged along the column direction and the second transfer transistor TX2 and the third transfer transistor TX3 are arranged along the column direction. In FIG. 3B, the first transfer transistor TX1 and the third transfer transistor TX3 are arranged along a first diagonal line and the second transfer transistor TX2 and the fourth transfer transistor TX4 are arranged along a second diagonal line crossing the first diagonal line. Thus, when the first to fourth transfer transistors TX1 to TX4 have the right-angled triangle shape, the first to fourth transfer transistors TX1 to TX4 may have their hypotenuses that are arranged two virtual diagonal lines forming an X-shape. One side of each of the first to fourth transfer transistors TX1 to TX4 may abut the corresponding STI region 30 so as to be parallel to the corresponding DTI region 20, and another side of each of the first to fourth transfer transistors TX1 to TX4 may abut the corresponding well-tab region of the first to fourth well-tab regions 51 to 54. The oblique sides of the first to fourth transfer transistors TX1 to TX4, for example, the hypotenuses of the first to fourth transfer transistors TX1 to TX4 having the right-angled triangle shape, may abut the first to fourth floating diffusion regions FD1 to FD4, respectively.

The first to fourth floating diffusion regions FD1 to FD4 may include the first floating diffusion region FD1, the second floating diffusion region FD2, the third floating diffusion region FD3, and the fourth floating diffusion region FD4, which are arranged in a matrix shape including a row and a column. The first to fourth floating diffusion regions FD1 to FD4 may include N-type ions doped with phosphorus (P) or arsenic (As). Thus, the first to fourth floating diffusion regions FD1 to FD4 may be N-type doped regions.

The plurality of N-type doped regions Na, Nb, Nc1 to Nc3, Nd1 to Nd3, and Ne1 to Ne3 may include the drain region Na and source region Nb of the reset transistor RX, the drain regions Nc1 to Nc3 and source regions Nd1 to Nd3 of the drive transistors DX1 to DX3, and the drain regions Nd1 to Nd3 and source regions Ne1 to Ne3 of the select transistors SX1 to SX3. The same regions Nd1 to Nd3 are used for the source regions of the drive transistors DX1 to DX3 and the drain regions of the select transistors SX1 to SX3. Thus, the drive transistors DX1 to DX3 and the select transistors SX1 to SX3 may share common regions for the source regions of the drive transistors DX1 to DX3 and the drain regions of the select transistors SX1 to SX3.

The first to fourth floating diffusion regions FD1 to FD4 and the plurality of N-type doped regions Na, Nb, Nc1 to Nc3, Nd1 to Nd3, and Ne1 to Ne3 may include N-type ions doped with P or As. The first to fourth well-tab regions 51 to 54 and the first to fourth center isolation regions 61 to 64 may be P-type doped regions including P-type ions doped with boron (B).

The first to fourth well-tab regions 51 to 54 may include regions for well connections. The first to fourth well-tab regions 51 to 54 may be electrically and/or geometrically coupled to the first to fourth center isolation regions 61 to 64, respectively. The plurality of N-type regions Na, Nb, Nc1 to Nc3, Nd1 to Nd3, and Ne1 to Ne3 may be electrically and/or geometrically isolated from each other by the DTI regions 20, the STI regions 30, the first to fourth well-tab regions 51 to 54, the first to fourth center isolation regions 61 to 64, the first to fourth transfer transistors TX1 to TX4, the first to third drive transistors DX1 to DX3, the first to third select transistors SX1 to SX3, and/or the reset transistor RX.

The first to fourth FD contacts 81 to 84 may be formed or disposed in or on the first to fourth floating diffusion regions FD1 to FD4, respectively. In or on the source region Nb of the reset transistor RX, an FD reset contact 85 may be formed/disposed so as to be electrically coupled to the first to fourth FD contacts 81 to 84 within the first to fourth floating diffusion regions FD1 to FD4. In or on the drain region Na of the reset transistor RX and the drain regions Nc1 to Nc3 of the drive transistors DX, supply voltage contacts 86R and 86D1 to 86D3 may be disposed so as to be coupled to the supply voltage VDD. In or on the source regions Ne1 to Ne3 of the select transistors SX1 to SX3, output contacts 87_1 to 87_3 may be formed or disposed so as to be electrically coupled to the output node Vout. In or on the first to fourth well-tab regions 51 to 54, pick-up contacts 88_1 to 88_4 may be formed to provide electrical contacts. Through the pick-up contacts 88_1 to 88_4, a ground voltage VSS may be provided to the first to fourth well-tab regions 51 to 54. The first to fourth well-tab regions 51 to 54 may abut the STI regions 30, the first to fourth transfer transistors TX1 to TX4, and the drain region Na of the reset transistor RX. Although the example in FIG. 3B shows that the first to fourth will-tab regions 51 to 54 abut the first to fourth transfer transistors Tx1 to TX4, other implementations are also possible. In some implementations, the first to fourth well-tab regions 51 to 54 may be spaced apart from the first to fourth transfer transistors TX1 to TX4, respectively.

Figure 3C:
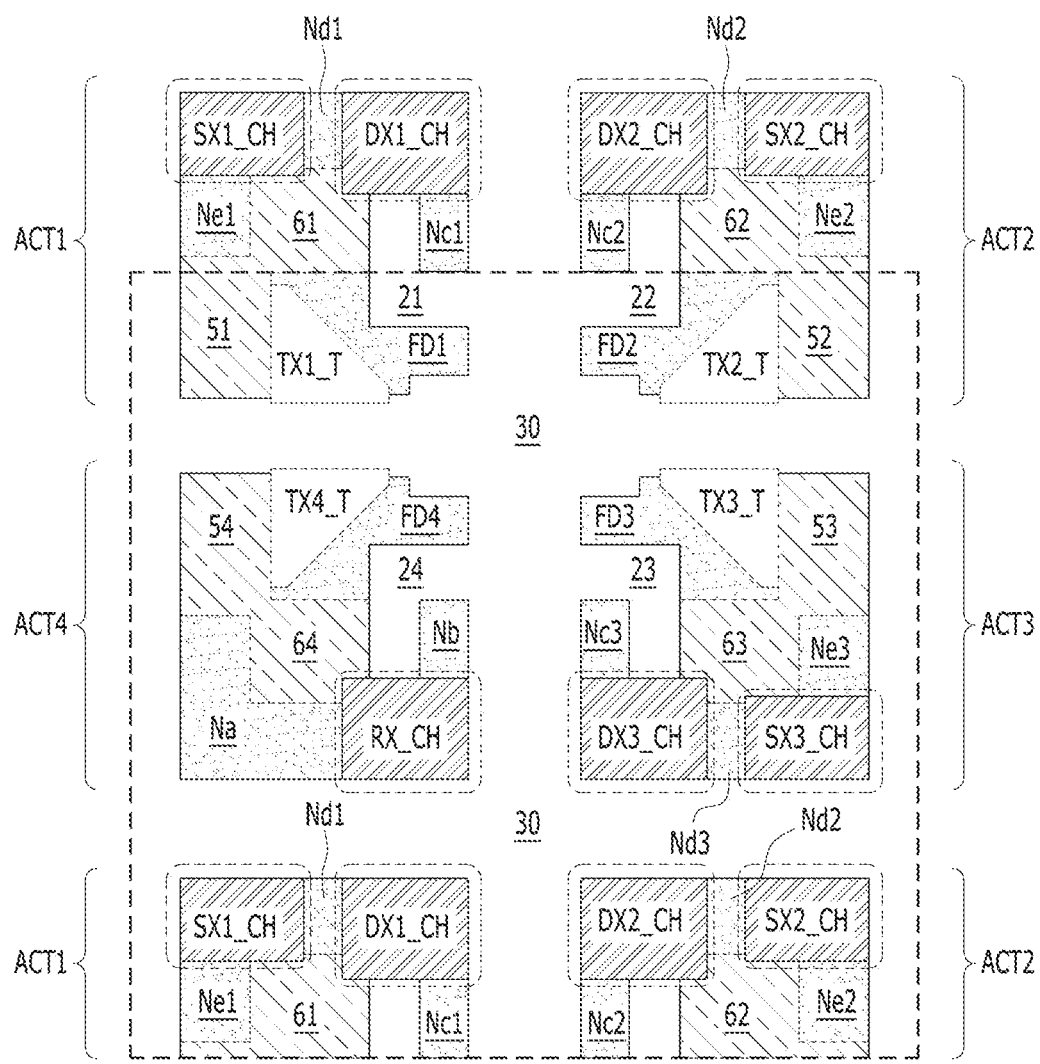
FIG. 3C illustrates a conceptual layout of first to fourth active regions defined by a shallow trench isolation (STI) region based on some implementations of the disclosed technology.

FIG. 3C illustrates a conceptual layout of first to fourth active regions ACT1 to ACT4 defined by the STI region 30. In FIG. 3C, the virtual dotted lines are used for indicating the shapes of trenches TX1_T to TX4_T in which the first to fourth transfer transistors TX1 to TX4 are formed and the shapes in which gate patterns of pixel transistors RX, DX1 to DX3, and SX1 to SX3 are formed.

Referring to FIG. 3C, the first active region ACT1 may include the first floating diffusion region FD1, the channel region DX1_CH, drain region Nc1, and source region Nd1 of the first drive transistor DX1, the channel region SX1_CH, drain region Nd1, and source region Ne1 of the first select transistor SX1, the first well-tab region 51, and the first center isolation region 61. The first active region ACT1 may be surrounded and defined by the STI region 30. The first transfer transistor trench TX1_T may be formed in the first active region ACT1 so as to abut the first active region ACT1 and the STI region 30. As a specific example as shown in FIG. 3C, when the first transfer transistor trench TX1_T has a right-angled triangle shape, one side of the first transfer transistor trench TX1_T abuts the first active region ACT1 and the STI region 30 and the remaining sides of the first transfer transistor trench TX1_T abut the well-tab region 51 and the first floating diffusion region FD1.

The second active region ACT2 may include the second floating diffusion region FD2, the channel region DX2_CH, drain region Nc2, and source region Nd2 of the second drive transistor DX2, the channel region SX2_CH, drain region Nd2 and source region Ne2 of the second select transistor SX2, the second well-tab region 52, and the second center isolation region 62. The second active region ACT2 may be surrounded and defined by the STI region 30. The second transfer transistor trench TX2_T may be formed in the second active region ACT2 so as to abut one side of the second active region ACT2 and the STI region 30. As a specific example as shown in FIG. 3C, when the second transfer transistor trench TX2_T has a right-angled triangle shape, one side of the second transfer transistor trench TX2_T abuts the second active region ACT2 and the STI region 30 and the remaining sides of the second transfer transistor trench TX2_T abut the well-tab region 52 and the second floating diffusion region FD2.

The third active region ACT3 may include the third floating diffusion region FD3, the channel region DX3_CH, drain region Nc3, and source region Nd3 of the third drive transistor DX3, the channel region SX3_CH, drain region Nd3 and source region Ne3 of the third select transistor SX3, the third well-tab region 53 and the third center isolation region 63. The third active region ACT3 may be surrounded and defined by the STI region 30. The third transfer transistor trench TX3_T may be formed in the third active region ACT3 so as to abut one side of the third active region ACT3 and the STI region 30. As a specific example as shown in FIG. 3C, when the third transfer transistor trench TX3_T has a right-angled triangle shape, one side of the third transfer transistor trench TX3_T abuts the third active region ACT3 and the STI region 30 and the remaining sides of the third transfer transistor trench TX3_T abut the well-tab region 51 and the third floating diffusion region FD3.

The fourth active region ACT4 may include the fourth floating diffusion region FD4, the channel region RX_CH, drain region Na and source region Nb of the reset transistor RX, the fourth well-tab region 54 and the fourth center isolation region 64. The fourth active region ACT4 may be surrounded and defined by the STI region 30. The fourth transfer transistor trench TX4_T may be formed in the fourth active region ACT4 so as to abut one side of the fourth active region ACT4 and the STI region 30. As a specific example as shown in FIG. 3C, when the fourth transfer transistor trench TX4_T has a right-angled triangle shape, one side of the fourth transfer transistor trench TX4_T abuts the fourth active region ACT4 and the STI region 30 and the remaining sides of the fourth transfer transistor trench TX4_T abut the well-tab region 54 and the fourth floating diffusion region FD3.

The first to fourth floating diffusion regions FD1 to FD4, the first to fourth well-tab regions 51 to 54, the first to third drive transistors DX1 to DX3, the first to third select transistors SX1 to SX3, the reset transistor RX , and the drain region Na of the reset transistor RX may be disposed on four corners of the STI regions 30 and/or the active regions. For example, in the first active region ACT1, the channel region SX1_CH of the first select transistor SX1 may be disposed on the left top corner, the channel region DX1_CH of the first drive transistor DX1 may be disposed on the right top corner, the first well-tab region 51 may be disposed on the left bottom corner, and the first floating diffusion region FD1 may be disposed on the right bottom corner. In the second active region ACT2, the channel region DX2_CH of the second drive transistor DX2 may be disposed on the left top corner, the channel region SX2_CH of the second select transistor SX2 may be disposed on the right top corner, the second floating diffusion region FD2 may be disposed on the left bottom corner, and the second well-tab region 52 may be disposed on the right bottom corner. In the third active region ACT3, the third floating diffusion region FD3 may be disposed on the left top corner, the third well-tab region 53 may be disposed on the right top corner, the channel region DX3_CH of the third drive transistor DX3 may be disposed on the left bottom corner, and the channel region SX3_CH of the third select transistor SX3 may be disposed on the right bottom corner. In the fourth active region ACT4, the fourth well-tab region 54 may be disposed on the left top corner, the fourth floating diffusion region FD4 may be disposed on the right top corner, the drain region Na of the reset transistor RX may be disposed on the left bottom corner, and the channel region RX_CH of the reset transistor RX may be disposed on the right bottom corner. Since the left top corner, the right top corner, the left bottom corner and the right bottom corner are relative positions, the positions of the corners may be changed depending on a viewing direction.

The first to fourth center isolation regions 61 to 64 may be disposed in a rectangular space defined by the DTI regions 20, i.e. the centers of the first to fourth active regions ACT1 to ACT4.

In a specific example as shown in FIG. 3C, each of the first to fourth floating diffusion regions FD1 to FD4 may include a protruding portion. The protruding portions of the first to fourth floating diffusion regions FD1 to FD4 may be disposed to face the DTI regions 20 (refer to FIG. 4A) close thereto. The receding portions extended from STI 30 may have a boundary receded from the protruding portions of the first to fourth floating diffusion regions FD1 to FD4. The protruding portions of the first to fourth floating diffusion regions FD1 to FD4 may abut the receding portions extended from the STI regions 30. The receding portions extended from the STI regions 30 may include first to fourth extensions 21 to 24. In some implementations, the first to fourth extensions 21 to 24 may have an elbow shape. The first extension 21 may be extended and disposed between the first floating diffusion region FD1 of the first active region ACT1 and the drain region Nc1 of the first drive transistor DX1 and between the first center isolation region 61 and the drain region Nc1 of the first drive transistor DX1. The first extension 21 may abut the first floating diffusion region FD1, the drain region Nc1 of the first drive transistor DX1, the first center isolation region 61, and the channel region DX1_CH of the first drive transistor DX1. The second extension 22 may be extended and disposed between the second floating diffusion region FD2 of the second active region ACT2 and the drain region Nc2 of the second drive transistor DX2 and between the second center isolation region 62 and the drain region Nc2 of the second drive transistor DX2. The second extension 22 may abut the second floating diffusion region FD2, the drain region Nc2 of the second drive transistor DX2, the second center isolation region 62 and the channel region DX2_CH of the second drive transistor DX2. The third extension 23 may be extended and disposed between the third floating diffusion region FD3 of the third active region ACT3 and the drain region Nc3 of the third drive transistor DX3 and between the third center isolation region 63 and the drain region Nc3 of the third drive transistor DX3. The third extension 23 may abut the third floating diffusion region FD3, the drain region Nc3 of the third drive transistor DX3, the third center isolation region 63, and the channel region DX3_CH of the third drive transistor DX3. The fourth extension 24 may be extended and disposed between the fourth floating diffusion region FD4 of the fourth active region ACT4 and the source region Nb of the reset transistor RX and between the fourth center isolation region 64, and the source region Nb of the reset transistor RX. The fourth extension 24 may abut the fourth floating diffusion region FD4, the source region Nb of the reset transistor RX, the fourth center isolation region 64, and the channel region RX_CH of the reset transistor RX.

The first active region ACT1 may be divided into two parts by the first well-tab region 51 and the first center isolation region 61 which function as a first isolation structure of the first active region ACT1. In the first active region ACT1, the first isolation structure including the first well-tab region 51 and the first center isolation region 61 may electrically and geometrically isolate the first floating diffusion region FD1 from first transistor active regions including, for example, the drain region Nc1, the channel region DX1_CH, and the source region Nd1 of the first drive transistor DX1 and the drain region Nd1, the channel region SX1_CH, and the source region Ne1 of the first select transistor SX1. The source region of the first drive transistor DX1 and the drain region of the first select transistor SX1 may be the same as each other. Since the channel region DX1_CH of the first drive transistor DX1 and the channel region SX1_CH of the first select transistor SX1 are P-type regions including doped P-type ions, the drain region Nc1 and source region Nd1 of the first drive transistor DX1 may be electrically and geometrically isolated from each other by the channel region DX1_CH of the first drive transistor DX1, and the drain region Nd1 and source region Ne1 of the first select transistor SX1 may be electrically and geometrically isolated from each other by the channel region SX1_CH of the first select transistor SX1. For example, the first floating diffusion region FD1 may be electrically and geometrically isolated from the first transistor active regions Nc1, Nd1, Ne1, SX1_CH and DX1_CH by the STI region 30, the first transfer transistor trench TX1_T or the first transfer transistor TX1, and the first isolation structure including the first well-tab region 51 and the first center isolation region 61.

The second active region ACT2 may be divided into two parts by the second well-tab region 52 and the second center isolation region 62 which function as a second isolation structure of the second active region ACT2. In the second active region ACT2, the second isolation structure including the second well-tab region 52 and the second center isolation region 62 may electrically and geometrically isolate the second floating diffusion region FD2 from second transistor active regions including, for example, the drain region Nc2, the channel region DX2_CH, and the source region Nd2 of the second drive transistor DX2, and the drain region Nd2, the channel region SX2_CH, and the source region Ne2 of the second select transistor SX2. The source region of the second drive transistor DX2 and the drain region of the second select transistor SX2 may be the same as each other. Since the channel region DX2_CH of the second drive transistor DX2 and the channel region SX2_CH of the second select transistor SX2 are P-type regions including doped P-type ions, the drain region Nc2 and source region Nd2 of the second drive transistor DX2 may be electrically and geometrically isolated from each other by the channel region DX2_CH of the second drive transistor DX2, and the drain region Nd2 and source region Ne2 of the second select transistor SX2 may be electrically and geometrically isolated from each other by the channel region SX2_CH of the second select transistor SX2. For example, the second floating diffusion region FD2 may be electrically and geometrically isolated from the second transistor active regions by the STI region 30, the second transfer transistor trench TX2_T or the second transfer transistor TX2, and the second isolation structure including the second well-tab region 52 and the second center isolation region 62.

The third active region ACT3 may be divided into two parts by the third well-tab region 53 and the third center isolation region 63 which function as a third isolation structure of the third active region ACT3. In the third active region ACT3, the third isolation structure including the third well-tab region 53 and the third center isolation region 63 may electrically and geometrically isolate the third floating diffusion region FD3 from third transistor active regions which, for example, include, the drain region Nc3, the channel region DX3_CH, and the source region Nd3 of the third drive transistor DX3 and the drain region Nd3, the channel region SX3_CH, and the source region Ne3 of the third select transistor SX3. The source region of the third drive transistor DX3 and the drain region of the third select transistor SX3 may be the same as each other. Since the channel region DX3_CH of the third drive transistor DX3 and the channel region SX3_CH of the third select transistor SX3 are P-type regions including doped P-type ions, the drain region Nc3 and source region Nd3 of the third drive transistor DX3 may be electrically and geometrically isolated from each other by the channel region DX3_CH of the third drive transistor DX3, and the drain region Nd3 and source region Ne3 of the third select transistor SX3 may be electrically and geometrically isolated from each other by the channel region SX3_CH of the third select transistor SX3. For example, the third floating diffusion region FD3 may be electrically and geometrically isolated from the third transistor active regions by the STI region 30, the third transfer transistor trench TX3_T or the third transfer transistor TX3, and the third isolation structure including the third well-tab region 53 and the third center isolation region 63.

The fourth active region ACT4 may be divided into two parts by the fourth well-tab region 54 and the fourth center isolation region 64 which function as a fourth isolation structure of the fourth active region ACT4. In the fourth active region ACT4, the fourth isolation structure including the fourth well-tab region 54 and the fourth center isolation region 64 may electrically and geometrically isolate the fourth floating diffusion region FD4 from fourth transistor active regions which, for example, include the drain region Na, the channel region RX_CH, and the source region Nb of the reset transistor RX. Since the channel region RX_CH of the reset transistor RX is a P-type region including doped P-type ions, the drain region Na and the source region Nb of the reset transistor RX may be electrically and geometrically isolated from each other by the channel region RX_CH of the reset transistor RX. For example, the fourth floating diffusion region FD4 may be electrically and geometrically isolated from the fourth transistor active regions by the STI region 30, the fourth transfer transistor trench TX4_T or the fourth transfer transistor TX4, and the fourth isolation structure including the fourth well-tab region 54 and the fourth center isolation region 64.

FIGS. 4A to 4D are longitudinal cross-sectional views of a unit pixel PX of an image sensor 800 based on some implementations of the disclosed technology, which are taken along the lines I-I', II-II', III-III' and IV-IV' of FIG. 3B. Referring to FIGS. 4A to 4D, the image sensor 800 may include photodiodes PD formed in a substrate 10, the DTI regions 20, the STI region 30, the transistors RX, DXs and SXs formed on the top surface of the substrate 10, the transfer transistors TXx recessed to be buried in the substrate 10, the floating diffusion regions FDx formed in the substrate 10 so as to abut the top surface of the substrate 10, the N-type regions Na, Nb, Nc1 to Nc3, Nd1 to Nd3, Ne1 to Ne3 and P-type regions 51 to 54 and 61 to 64, an anti-reflection layer 90 formed on the bottom surface of the substrate 10, grid patterns 95, color filters CF, and micro-lenses ML.

The anti-reflection layer 90 may include a silicon oxide (SiO2) layer, an aluminum oxide ($Al_2O_3$) layer, a hafnium oxide ($HfO_2$) layer, a tantalum oxide ($Ta_2O_5$) layer, a silicon nitride (SiN) layer or combinations thereof. The grid patterns 95 may include metal. When seen from the top, the grid patterns 95 may have a same layout as the DTI region 20 so as to be vertically aligned with the DTI region 20. The color filters CF may be formed in a space defined by the grid patterns 95, and the micro-lenses ML may be formed on or over the color filters CF.

Figure 4A:
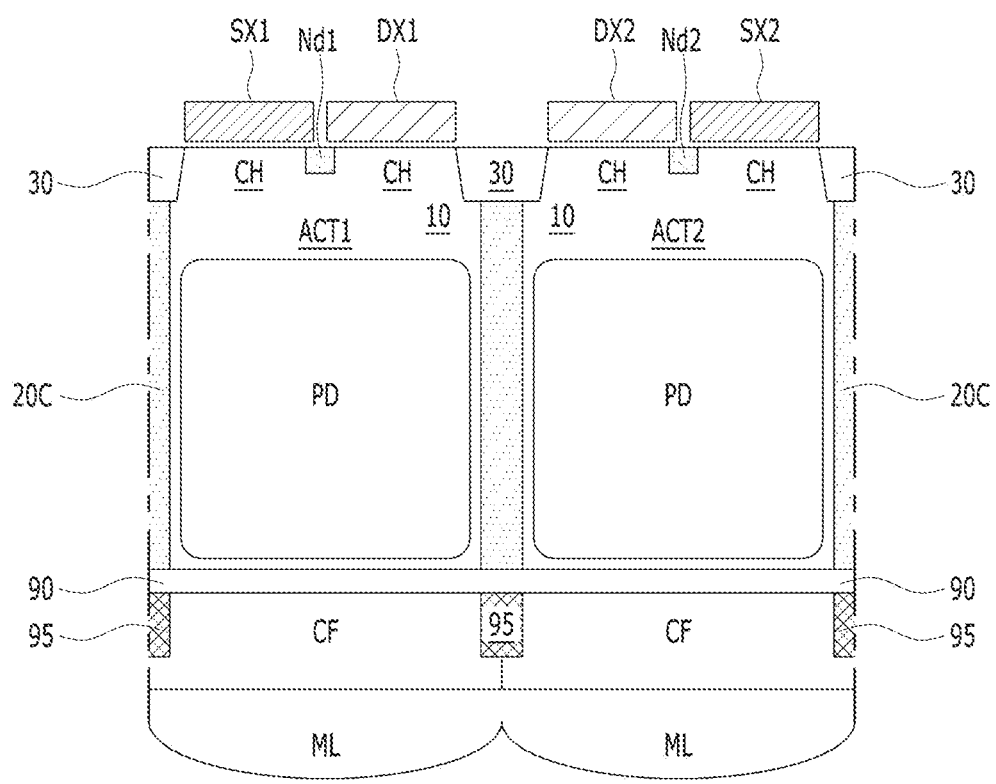
FIGS. 4A to 4D are longitudinal cross-sectional views of a unit pixel of an image sensor, taken along the lines I-I', II-II', III-III' and IV-IV' of FIG. 3B.

Referring to FIGS. 3B, 3C and 4A, the source region Nd1 of the first drive transistor DX1 (or the drain region Nd1 of the first select transistor SX1) in the first active region ACT1 may be electrically and geometrically isolated from the other N-type regions Nc1 and Ne by the channel region DX1_CH of the first drive transistor DX1 and the channel region SX1_CH of the first select transistor SX1. In the second active region ACT2, the source region Nd2 of the second drive transistor DX2 (or the drain region Nd2 of the second select transistor SX2) may be electrically and geometrically isolated from the other N-type regions Nc2 and Ne2 by the channel region DX2_CH of the second drive transistor DX2 and the channel region SX2_CH of the second select transistor SX2. In the third active region ACT3, the source region Nd3 of the third drive transistor DX3 (or the drain region Nd3 of the third select transistor SX2) may be electrically and geometrically isolated from the other N-type regions Nc3 and Ne3 by the channel region DX3_CH of the third drive transistor DX3 and the channel region SX3_CH of the third select transistor SX3. The channel regions DX1_CH to DX3_CH may be or include P-type regions including doped P-type ions.

Figure 4B:
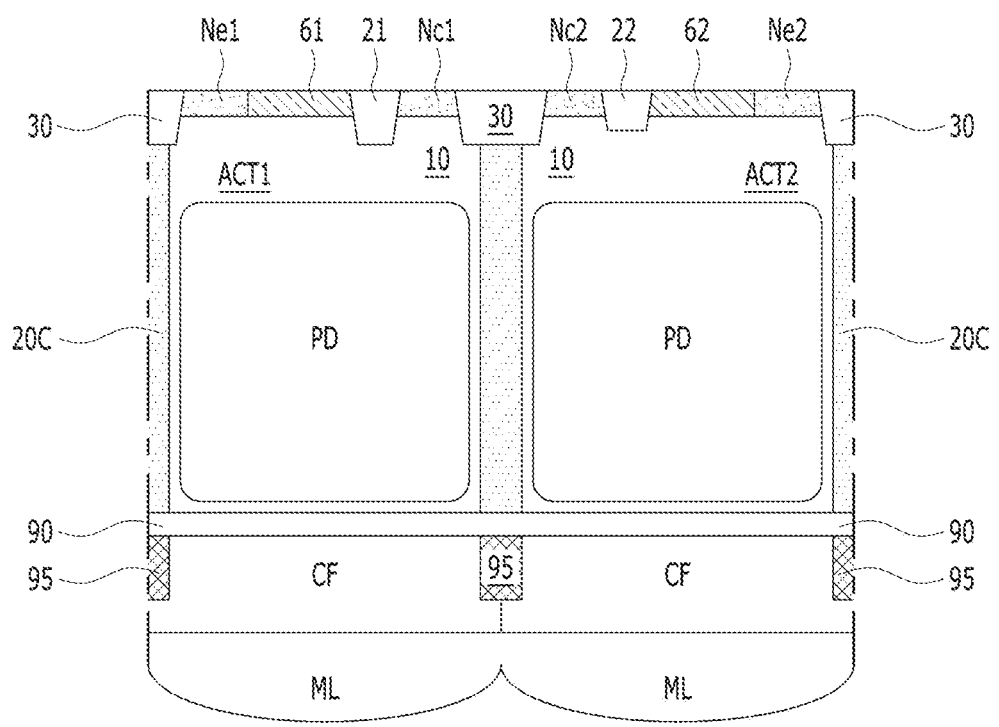

Referring to FIGS. 3C and 4B, the drain region Nc1 of the first drive transistor DX1 and the source region Ne1 of the first select transistor SX1 in the first active region ACT1 may be electrically and geometrically isolated from each other by the first center isolation region 61 and the STI region 30 including the extension region 21. In the second active region ACT2, the drain region Nc2 of the second drive transistor DX2 and the source region Ne2 of the second select transistor SX2 may be electrically and geometrically isolated from each other by the STI region 30 including the extension region 22 and the second center isolation region 62. In the third active region ACT3, the drain region Nc3 of the third drive transistor DX3 and the source region Ne3 of the third select transistor SX3 may be electrically and geometrically isolated from each other by the STI region 30 including the extension region 23 and the third center isolation region 63.

Figure 4C:
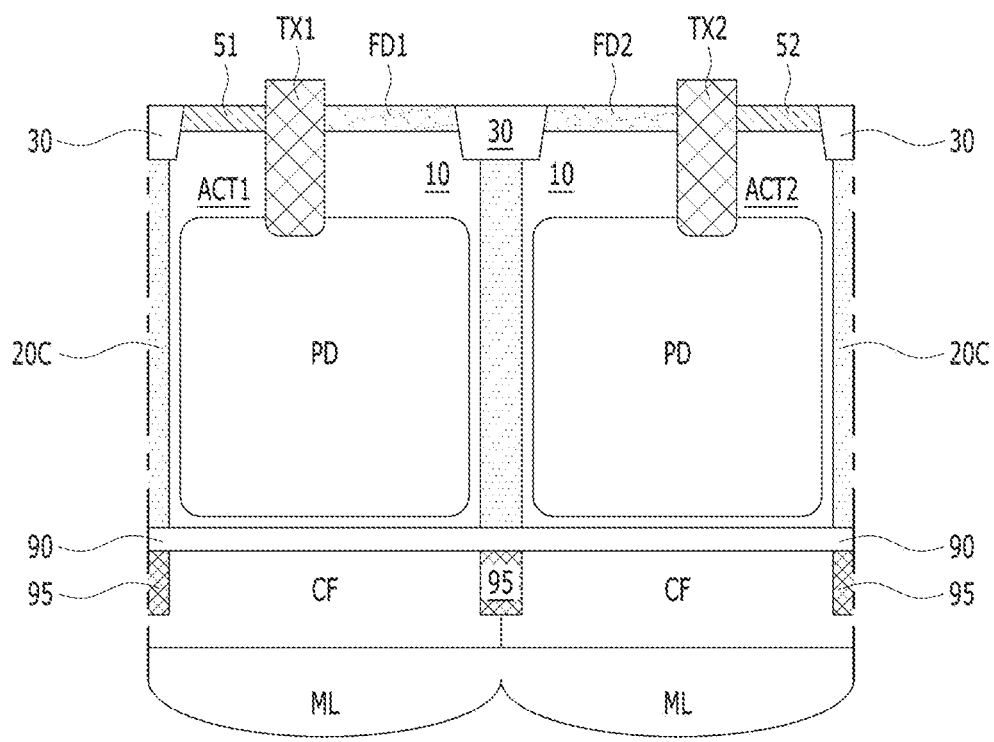

Referring to FIGS. 3C and 4C, the first and second transfer transistors TX1 and TX2 may have a stud or pillar shape buried in the substrate 10. The bottoms of the first and second transfer transistors TX1 and TX2 may protrude into the photodiodes PD. In another embodiment, the bottoms of the first and second transfer transistors TX1 and TX2 may be isolated from the photodiodes PD without contacting the photodiodes PD. The first floating diffusion region FD1 may be formed to abut one surface of the first transfer transistor TX1, and the first well-tab region 51 may be formed to abut the other surface of the first transfer transistor TX1. The second floating diffusion region FD2 may be formed to abut one surface of the second transfer transistor TX2, and the second well-tab region 52 may be formed to abut the other surface of the second transfer transistor TX2. The third and fourth transfer transistors TX3 and TX4 may have a stud or pillar shape buried in the substrate 10. The bottoms of the third and fourth transfer transistors TX3 and TX4 may protrude into the photodiodes PD. In another embodiment, the bottoms of the third and fourth transfer transistors TX3 and TX4 may be isolated from the photodiodes PD without contacting the photodiodes PD. The third floating diffusion region FD3 may be formed to abut one surface of the third transfer transistor TX3, and the third well-tab region 53 may be formed to abut the other surface of the third transfer transistor TX3. The fourth floating diffusion region FD4 may be formed to abut one surface of the fourth transfer transistor TX4, and the fourth well-tab region 54 may be formed to abut the other surface of the fourth transfer transistor TX4.

Figure 4D:
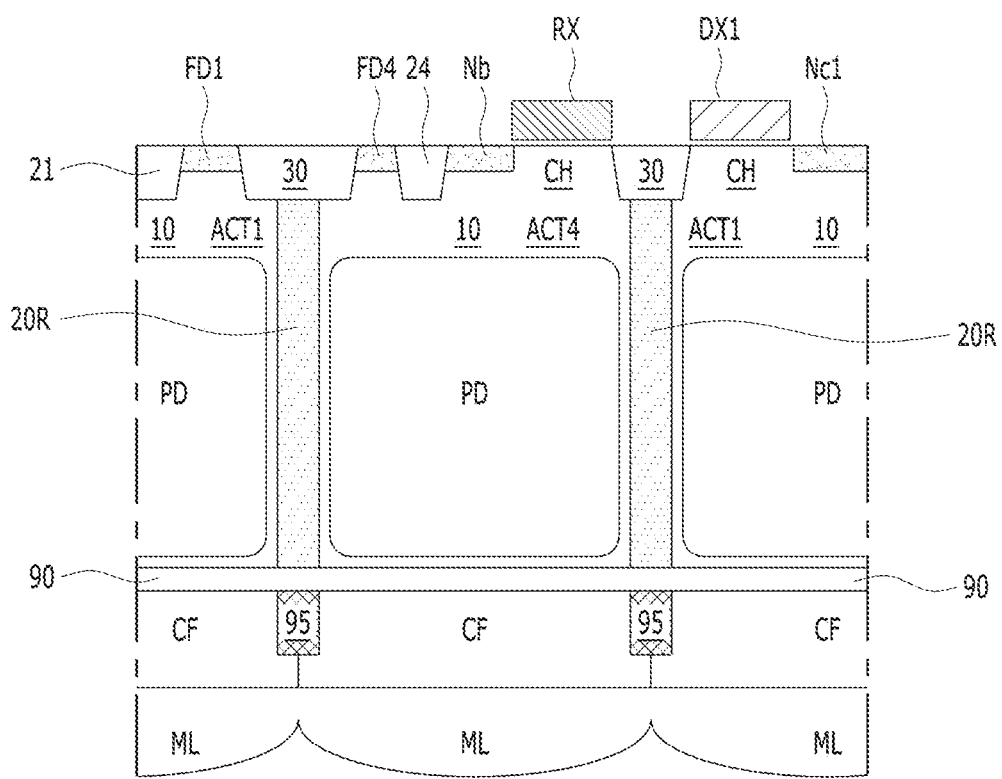

Referring to FIGS. 3C and 4D, the first floating diffusion region FD1 and the drain region Nc1 of the first drive transistor DX1 in the first active region ACT1 may be electrically and geometrically isolated from each other by the STI region 30, and the fourth floating diffusion region FD4 and the drain region Na of the reset transistor RX in the fourth active region ACT4 may be electrically and geometrically isolated from each other by the STI region 30. The second floating diffusion region FD2 and the drain region Nc2 of the second drive transistor DX2 in the second active region ACT2 may be electrically and geometrically isolated from each other by the STI region 30, and the third floating diffusion region FD3 and the drain region Nc3 of the third drive transistor DX3 in the third active region ACT3 may be electrically and geometrically isolated from each other by the STI region 30.

Figure 5A:
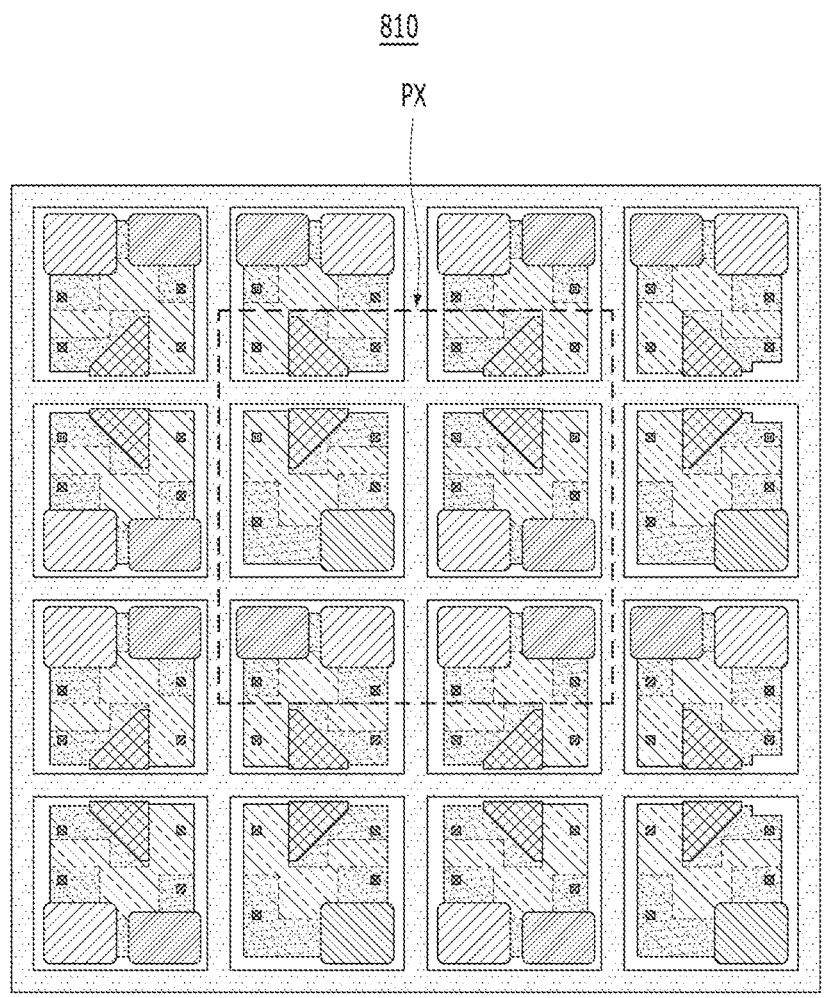
FIG. 5A illustrates an example of a schematic layout of a pixel array of an image sensor based on some implementations of the disclosed technology.
Figure 5B:
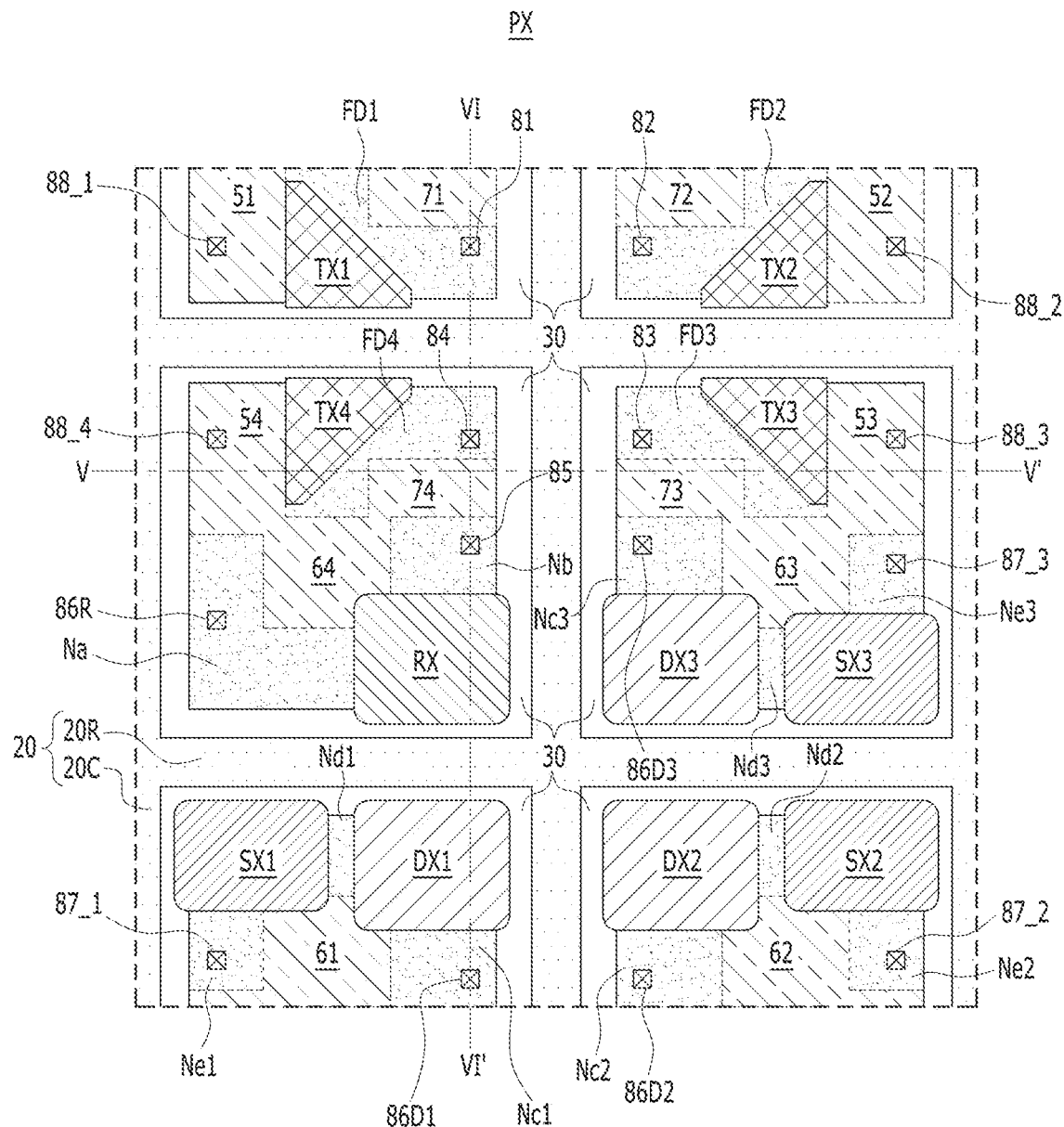
FIG. 5B is an expanded view of a unit pixel region of FIG. 5A.

FIG. 5A illustrates a schematic layout of a pixel array 810 of an image sensor 800 based on some implementations of the disclosed technology, and FIG. 5B is an expanded view of a unit pixel region PX of FIG. 5A. Referring to FIGS. 5A and 5B, the pixel array 810 may include DTI regions 20, STI regions 30, first to fourth floating diffusion regions FD1 to FD4, a plurality of N-type regions Na, Nb, Nc1 to Nc3, Nd1 to Nd3, and Ne1 to Ne3, first to fourth well-tab regions 51 to 54, first to fourth center isolation regions 61 to 64, first to fourth side isolation regions 71 to 74, first to fourth transfer transistors TX1 to TX4, first to third drive transistors DX1 to DX3, first to third select transistors SX1 to SX3, a reset transistor RX and a plurality of contacts 81 to 85, 86R, 86D1 to 86D3, 87_1 to 87_3 and 88_1 to 88_6. The DTI region 20 and the STI region 30 may define rectangular first to fourth active regions ACT1 to ACT4. The first to fourth well-tab regions 51 to 54, the first to fourth center isolation regions 61 to 64, and the first to fourth side isolation regions 71 to 74 may be electrically and geometrically coupled to one another. Other components which are not described in detail will be understood based on the descriptions with reference to FIGS. 3A and 3B.

Figure 5C:
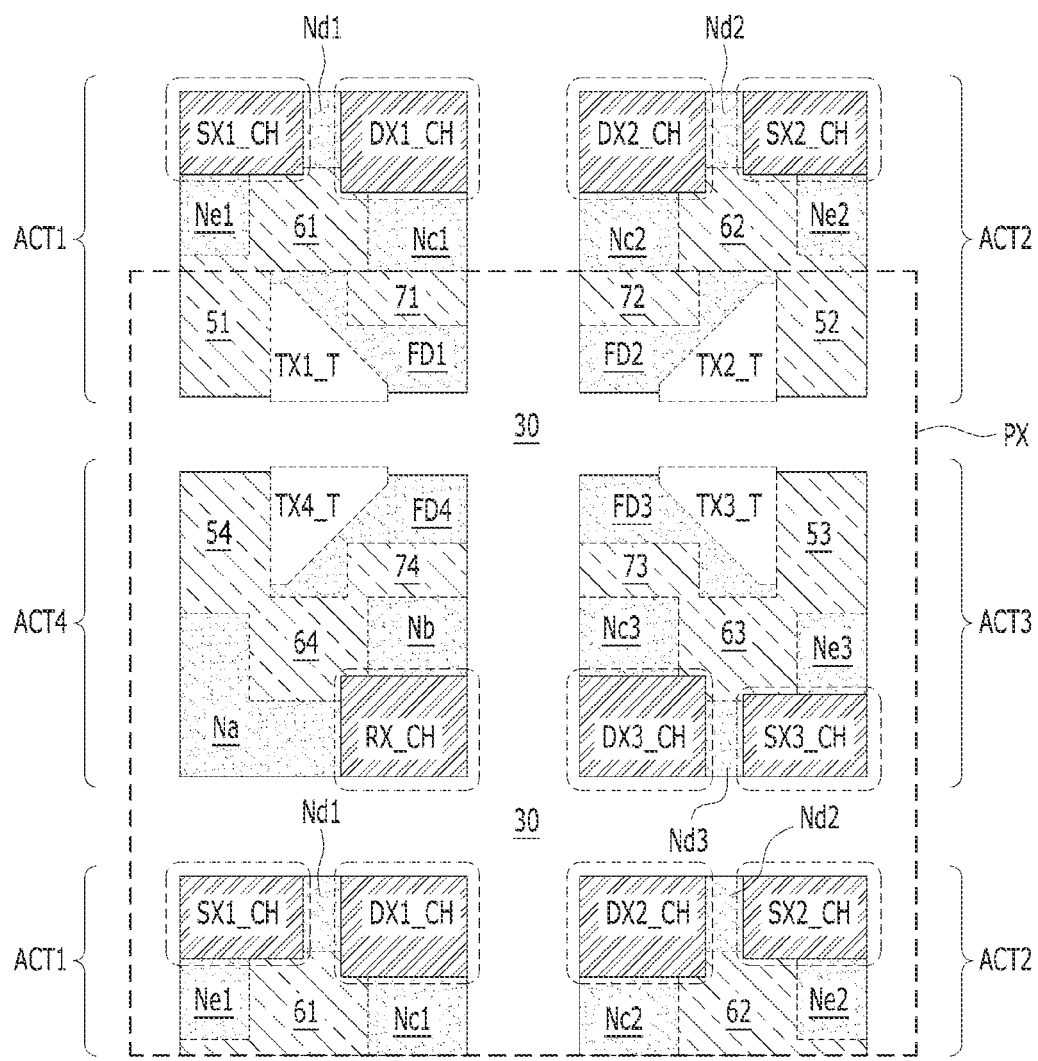
FIG. 5C illustrates a conceptual layout of first to fourth active regions defined by an STI region based on some implementations of the disclosed technology.

FIG. 5C illustrates a conceptual layout of first to fourth active regions ACT1 to ACT4 defined by STI regions 30. In FIG. 5C, the virtual dotted lines are used for indicating the shapes of trenches TX1_T to TX4_T for in which the first to fourth transfer transistors TX1 to TX4 are formed and the shapes in which gate patterns of pixel transistors RX, DX1 to DX3 and SX1 to SX3 are formed. Referring to FIG. 5C, the rectangular first to fourth active regions ACT1 to ACT4 may be defined by the STI regions 30. Components which are not described in detail here can be understood the descriptions with reference to FIG. 3C.

The first active region ACT1 may include the first floating diffusion region FD1, the channel region DX1_CH, drain region Nc1 and source region Nd1 of the first drive transistor DX1, the channel region SX1_CH, drain region Nd1 and source region Ne1 of the first select transistor SX1, the first well-tab region 51, the first center isolation region 61 and the first side isolation region 71. The second active region ACT2 may include the second floating diffusion region FD2, the channel region DX2_CH, drain region Nc2 and source region Nd2 of the second drive transistor DX2, the channel region SX2_CH, drain region Nd2 and source region Ne2 of the second select transistor SX2, the second well-tab region 52, the second center isolation region 62 and the second side isolation region 72. The third active region ACT3 may include the third floating diffusion region FD3, the channel region DX3_CH, drain region Nc3 and source region Nd3 of the third drive transistor DX3, the channel region SX3_CH, drain region Nd3 and source region Ne3 of the third select transistor SX3, the third well-tab region 53, the third center isolation region 63 and the third side isolation region 73. The fourth active region ACT4 may include the fourth floating diffusion region FD4, the channel region RX_CH, drain region Na and source region Nb of the reset transistor RX, the fourth well-tab region 54, the fourth center isolation region 64 and the fourth side isolation region 74. The first to fourth side isolation regions 71 to 74 may be P-type doped regions including P-type ions doped with boron (B).

The first to fourth floating diffusion regions FD1 to FD4, the first to fourth well-tab regions 51 to 54, the first to third drive transistors DX1 to DX3, the first to third select transistors SX1 to SX3, the reset transistor RX and the drain region Na of the reset transistor RX may be disposed on four corners of the STI regions 30 and/or the active regions. For example, in the first active region ACT1, the channel region SX1_CH of the first select transistor SX1 may be disposed on the left top corner, the channel region DX1_CH of the first drive transistor DX1 may be disposed on the right top corner, the first well-tab region 51 may be disposed on the left bottom corner, and the first floating diffusion region FD1 may be disposed on the right bottom corner. In the second active region ACT2, the channel region DX2_CH of the second drive transistor DX2 may be disposed on the left top corner, the channel region SX2_CH of the second select transistor SX2 may be disposed on the right top corner, the second floating diffusion region FD2 may be disposed on the left bottom corner, and the second well-tab region 52 may be disposed on the right bottom corner. In the third active region ACT3, the third floating diffusion region FD3 may be disposed on the left top corner, the third well-tab region 53 may be disposed on the right top corner, the channel region DX3_CH of the third drive transistor DX3 may be disposed on the left bottom corner, and the channel region SX3_CH of the third select transistor SX3 may be disposed on the right bottom corner. In the fourth active region ACT4, the fourth well-tab region 54 may be disposed on the left top corner, the fourth floating diffusion region FD4 may be disposed on the right top corner, the drain region Na of the reset transistor RX may be disposed on the left bottom corner, and the channel region RX_CH of the reset transistor RX may be disposed on the right bottom corner. Since the left top corner, the right top corner, the left bottom corner and the right bottom corner are relative positions, the positions of the corners may be changed depending on a viewing direction.

The first to fourth center isolation regions 61 to 64 may be disposed in a rectangular space defined by the DTI regions 20, i.e. the center of the first to fourth active regions ACT1 to ACT4. The first to fourth side isolation regions 71 to 74 may be disposed so as to abut one sides of the first to fourth active regions ACT1 to ACT4, respectively.

In some implementations, the first side isolation region 71 may be surrounded by the first center isolation region 61, the first floating diffusion region FD1, the drain region Nc1 of the first drive transistor DX1, and the STI region 30. Referring to FIG. 3C and FIG. 5C, the first side isolation region 71 may overlap a part of the first extension 21 of the STI region 30. Therefore, the first side isolation region 71 may be disposed between the first floating diffusion region FD1 and the drain region Nc1 of the first drive transistor DX1.

The second side isolation region 72 may be surrounded by the second center isolation region 62, the second floating diffusion region FD2, the drain region Nc2 of the second drive transistor DX2, and the STI region 30. Referring to FIG. 3C and FIG. 5C, the second side isolation region 72 may overlap a part of the second extension 22 of the STI region 30. Therefore, the second side isolation region 72 may be disposed between the second floating diffusion region FD2 and the drain region Nc2 of the second drive transistor DX2.

The third side isolation region 73 may be surrounded by the third center isolation region 63, the third floating diffusion region FD3, the drain region Nc3 of the third drive transistor DX3 and the STI region 30. Referring to FIG. 3C and FIG. 5C, the third side isolation region 73 may overlap a part of the third extension 23 of the STI region 30. Therefore, the third side isolation region 73 may be disposed between the third floating diffusion region FD3 and the drain region Nc3 of the third drive transistor DX3.

The fourth side isolation region 74 may be surrounded by the fourth center isolation region 64, the fourth floating diffusion region FD4, the source region Nb of the reset transistor RX and the STI region 30. Referring to FIG. 3C and FIG. 5C, the fourth side isolation region 74 may overlap a part of the fourth extension 24 of the STI region 30. Therefore, the fourth side isolation region 74 may be disposed between the fourth floating diffusion region FD4 and the source region Nb of the reset transistor RX.

The first active region ACT1 may be divided into two by the first well-tab region 51, the first center isolation region 61 and the first side isolation region 71 which function as a first isolation structure of the first active region ACT1. In the first active region ACT1, the first isolation structure including the first well-tab region 51, the first center isolation region 61 and the first side isolation region 71 may electrically and geometrically isolate the first floating diffusion region FD1 from the first transistor active regions which, for example, include the drain region Nc1, the channel region DX1_CH, and the source region Nd1 of the first drive transistor DX1, and the drain region Nd1, the channel region SX1_CH, and the source region Ne1 of the first select transistor SX1. The source region of the first drive transistor DX1 and the drain region of the first select transistor SX1 may be the same as each other. Since the channel region DX1_CH of the first drive transistor DX1 and the channel region SX1_CH of the first select transistor SX1 are P-type regions including doped P-type ions, the drain region Nc1 and source region Nd1 of the first drive transistor DX1 may be electrically and geometrically isolated from each other by the channel region DX1_CH of the first drive transistor DX1, and the drain region Nd1 and source region Ne1 of the first select transistor SX1 may be electrically and geometrically isolated from each other by the channel region SX1_CH of the first select transistor SX1. For example, the first floating diffusion region FD1 may be electrically and geometrically isolated from the first transistor active regions Nc1, Nd1, Ne1, SX1_CH and DX1_CH by the STI region 30, the first transfer transistor trench TX1 T or the first transfer transistor TX1, and the first isolation structure including the first well-tab region 51, the first center isolation region 61 and the first side isolation region 71.

The second active region ACT2 may be divided into two parts by the second well-tab region 52, the second center isolation region 62, and the second side isolation region 72, which function as a second isolation structure of the second active region ACT2. In the second active region ACT2, the second isolation structure including the second well-tab region 52, the second center isolation region 62, and the second side isolation region 72 may electrically and geometrically isolate the second floating diffusion region FD2 from second transistor active regions which include, for example, the drain region Nc2, the channel region DX2_CH and the source region Nd2 of the second drive transistor DX2 and the drain region Nd2, the channel region SX2_CH and the source region Ne2 of the second select transistor SX2. The source region of the second drive transistor DX2 and the drain region of the second select transistor SX2 may be the same as each other. Since the channel region DX2_CH of the second drive transistor DX2 and the channel region SX2_CH of the second select transistor SX2 are P-type regions including doped P-type ions, the drain region Nc2 and source region Nd2 of the second drive transistor DX2 may be electrically and geometrically isolated from each other by the channel region DX2_CH of the second drive transistor DX2, and the drain region Nd2 and source region Ne2 of the second select transistor SX2 may be electrically and geometrically isolated from each other by the channel region SX2 CH of the second select transistor SX2. For example, the second floating diffusion region FD2 may be electrically and geometrically isolated from the second transistor active regions Nd2, Ne2, SX2_CH and DX2_CH by the STI region 30, the second transfer transistor trench TX2_T or the second transfer transistor TX2, and the second isolation structure including the second well-tab region 52, the second center isolation region 62 and the second side isolation region 72.

The third active region ACT3 may be divided into two equal parts by the third well-tab region 53, the third center isolation region 63 and the third side isolation region 73 which function as a third isolation structure of the third active region ACT3. In the third active region ACT3, the third isolation structure including the third well-tab region 53, the third center isolation region 63 and the third side isolation region 73 may electrically and geometrically isolate the third floating diffusion region FD3 from third transistor active regions which include, for example, the drain region Nc3, the channel region DX3_CH and the source region Nd3 of the third drive transistor DX3 and the drain region Nd3, the channel region SX3_CH and the source region Ne3 of the third select transistor SX3. The source region of the third drive transistor DX3 and the drain region of the third select transistor SX3 may be the same as each other. Since the channel region DX3_CH of the third drive transistor DX3 and the channel region SX3_CH of the third select transistor SX3 are P-type regions including doped P-type ions, the drain region Nc3 and source region Nd3 of the third drive transistor DX3 may be electrically and geometrically isolated from each other by the channel region DX3_CH of the third drive transistor DX3, and the drain region Nd3 and source region Ne3 of the third select transistor SX3 may be electrically and geometrically isolated from each other by the channel region SX3_CH of the third select transistor SX3. For example, the third floating diffusion region FD3 may be electrically and geometrically isolated from the third transistor active regions Nd3, Ne3, SX3_CH and DX3_CH by the STI region 30, the third transfer transistor trench TX3_T or the third transfer transistor TX3, and the third isolation structure including the third well-tab region 53, the third center isolation region 63 and the third side isolation region 73.

The fourth active region ACT4 may be divided into two parts by a fourth isolation structure including the fourth well-tab region 54, the fourth center isolation region 64 and the fourth side isolation region 74 which function as a fourth isolation structure of the fourth active region ACT4. In the fourth active region ACT4, the fourth isolation structure including the fourth well-tab region 54, the fourth center isolation region 64 and the fourth side isolation region 74 may electrically and geometrically isolate the fourth floating diffusion region FD4 from the fourth transistor active regions which include, for example, the drain region Na, the channel region RX_CH, and the source region Nb of the reset transistor RX. Since the channel region RX_CH of the reset transistor RX is a P-type region including doped P-type ions, the drain region Na and the source region Nb of the reset transistor RX may be electrically and geometrically isolated from each other by the channel region RX_CH of the reset transistor RX. For example, the fourth floating diffusion region FD4 may be electrically and geometrically isolated from the fourth transistor active regions by the STI region 30, the fourth transfer transistor trench TX4_T or the fourth transfer transistor TX4, and the fourth isolation structure including the fourth well-tab region 54, the fourth center isolation region 64 and the fourth side isolation region 74.

Figure 6A:
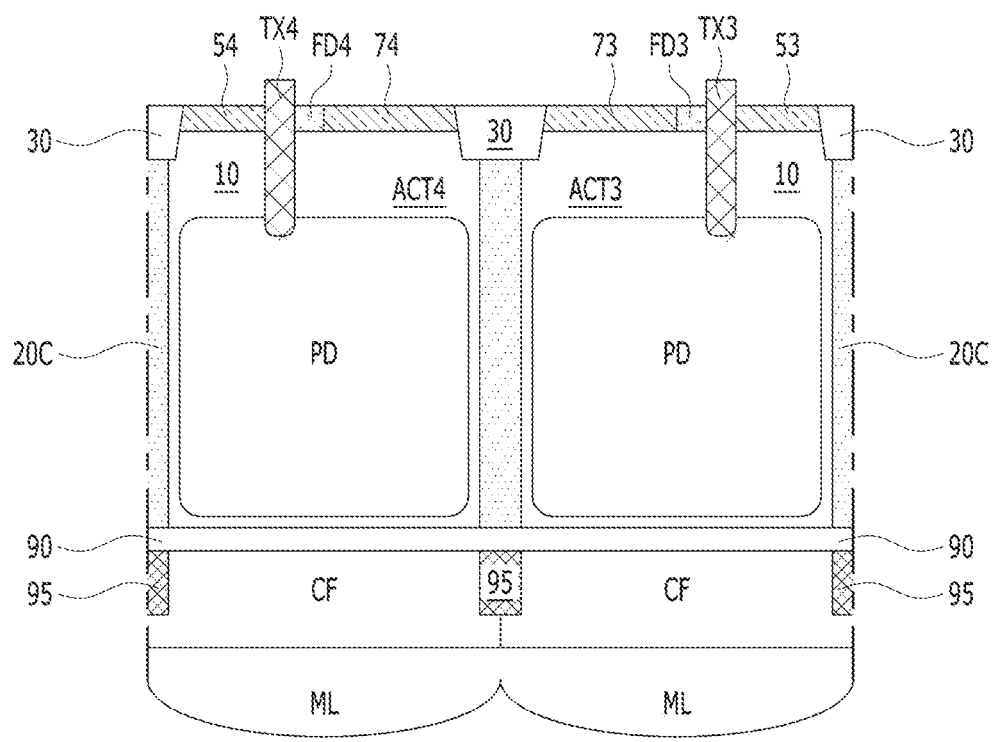
FIGS. 6A and 6B are longitudinal cross-sectional views of a unit pixel of an image sensor taken along the lines V-V' and VI-VI' of FIG. 5B.
Figure 6B:
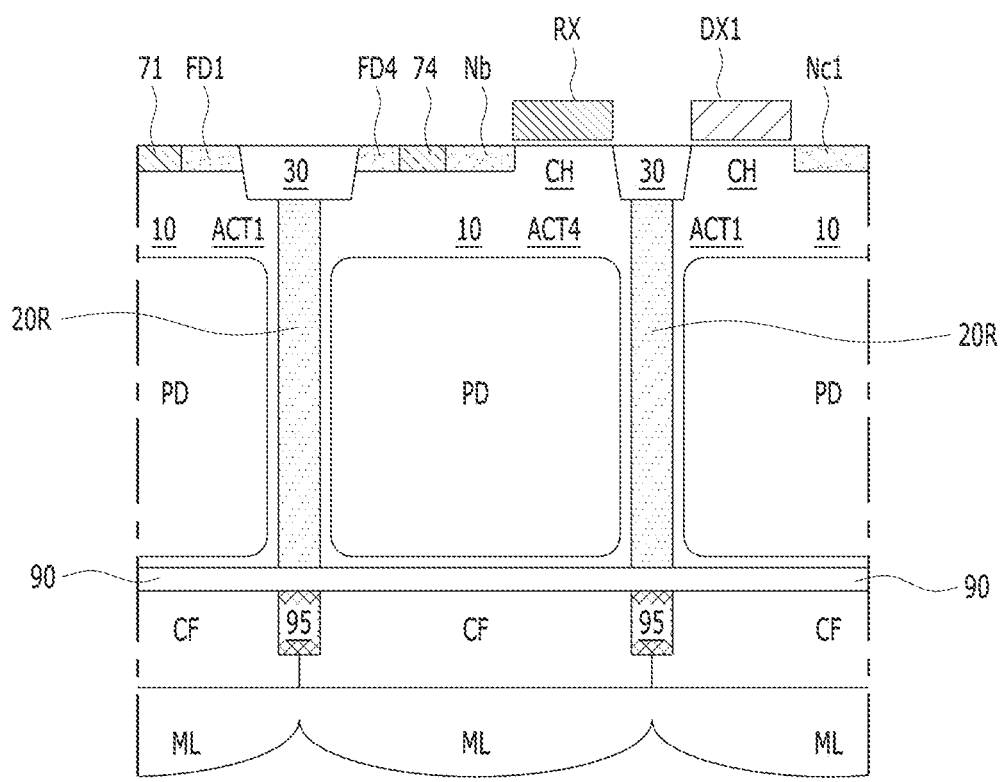

FIGS. 6A and 6B are longitudinal cross-sectional views of the unit pixel PX of an image sensor 800 based on some implementations of the disclosed technology, which are taken along the lines V-V' and VI'-VI' of FIG. 5B. Referring to FIGS. 5C and 6A, the third well-tab region 53 may be formed to abut one surface of the third transfer transistor TX3, and the third floating diffusion region FD3 may be formed to abut the other surface of the third transfer transistor TX3, in the third active region ACT3. The third floating diffusion region FD3 may abut the third side isolation region 73. In the fourth active region ACT4, the fourth well-tab region 54 may be formed to abut one surface of the fourth transfer transistor TX4, and the fourth floating diffusion region FD4 may be formed to abut the other surface of the fourth transfer transistor TX4. The fourth floating diffusion region FD4 may abut the fourth side isolation region 74.

Referring to FIGS. 5C and 6B, as compared to FIG. 4D, the first side isolation region 71 may be formed between the first floating diffusion region FD1 and the drain region Nc1 of the first drive transistor DX1 in the first active region ACT1. Thus, the first side isolation region 71 may electrically and geometrically isolate the first floating diffusion region FD1 and the drain region Nc1 of the first drive transistor DX1 from each other. In the fourth active region ACT4, the fourth side isolation region 74 may be formed between the fourth floating diffusion region FD4 and the source region Nb of the reset transistor RX. Thus, the fourth side isolation region 74 may electrically and geometrically isolate the fourth floating diffusion region FD4 from the source region Nb of the reset transistor RX from each other. In the second active region ACT2, the second side isolation region 72 may be formed between the second floating diffusion region FD2 and the drain region Nc2 of the second drive transistor DX2. Thus, the second side isolation region 72 may electrically and geometrically isolate the second floating diffusion region FD2 and the drain region Nc2 of the second drive transistor DX2 from each other. In the third active region ACT3, the third side isolation region 73 may be formed between the third floating diffusion region FD3 and the drain region Nc3 of the third drive transistor DX3. Thus, the third side isolation region 73 may electrically and geometrically isolate the third floating diffusion region FD3 and the drain region Nc3 of the third drive transistor DX3 from each other. Components which are not described in detail here can be understood with reference to the descriptions with regard to FIGS. 4A to 4D.

Figure 7A:
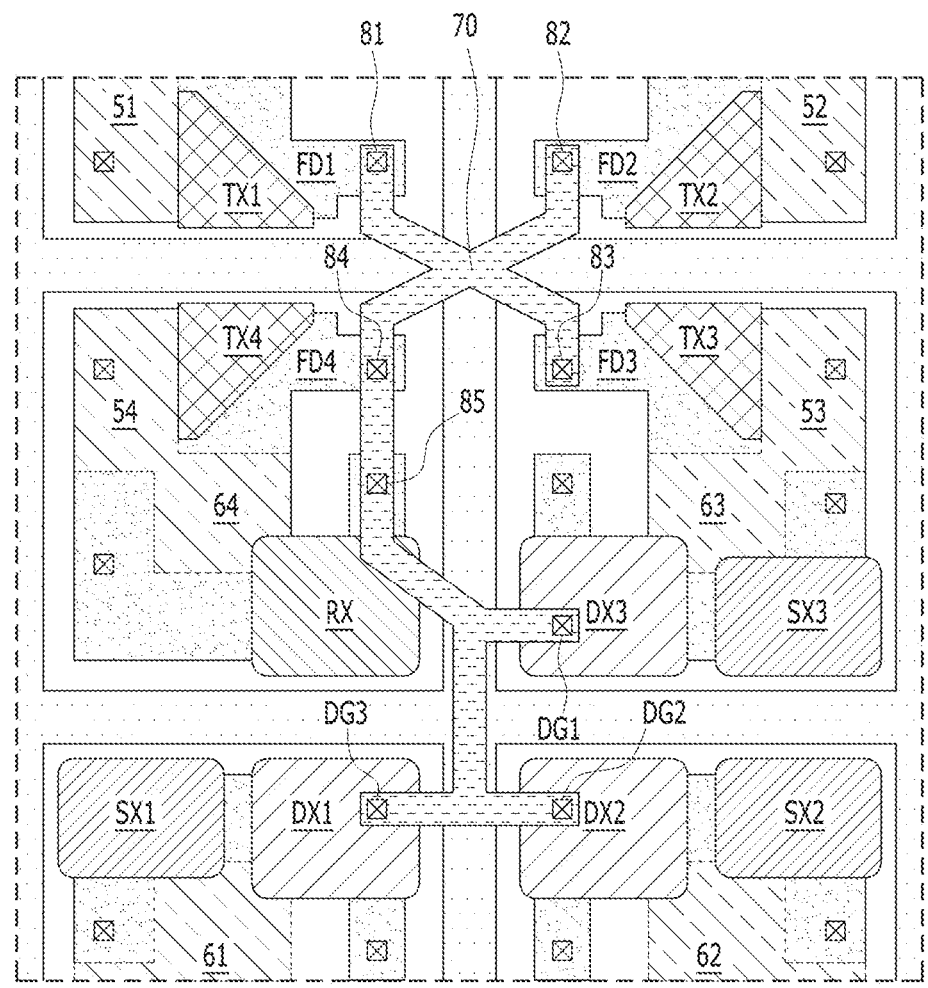
FIGS. 7A and 7B illustrate examples of layouts showing electrical connections made in a unit pixel of the image sensors based on some implementations of the disclosed technology.
Figure 7B:
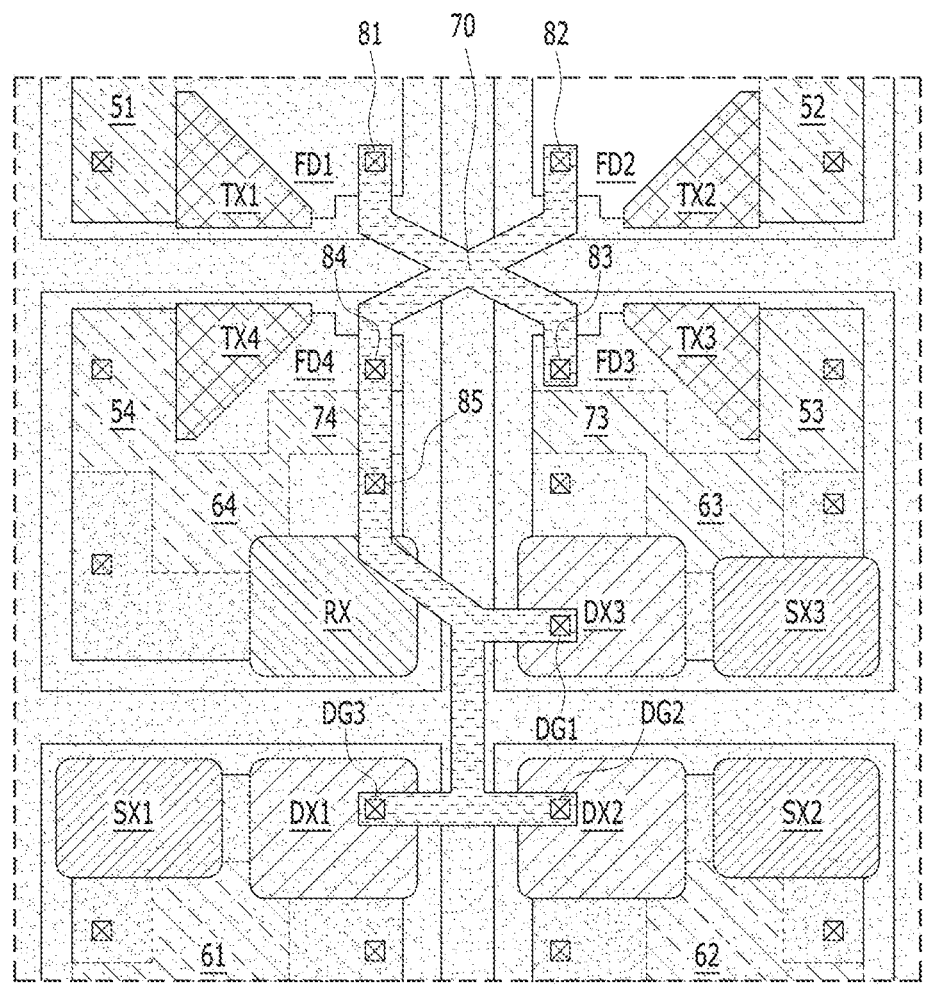

FIGS. 7A and 7B are layouts illustrating that the first to fourth floating diffusion regions FD1 to FD4, the source region Nb of the reset transistor RX and the gate electrodes of the first to third drive transistors DX1 to DX3 are electrically coupled in a unit pixel PX of an image sensor 800 based on some implementations of the disclosed technology. Referring to FIGS. 7A and 7B, the first FD contact 81 of the first floating diffusion region FD1, the second FD contact 82 of the second floating diffusion region FD2, the third FD contact 83 of the third floating diffusion region FD3, the fourth FD contact 84 of the fourth floating diffusion region FD4, the FD reset contact 85 of the source region Nb of the reset transistor RX, and drive contacts DG1 to DG3 on the gate electrodes of the first to fourth drive transistors DX1 to DX3 may be electrically connected to each other through metal wirings 70.

Figure 8:
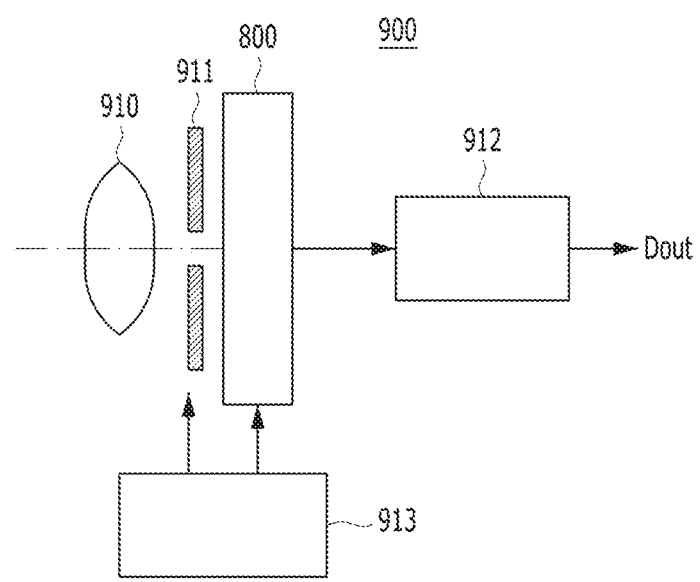
FIG. 8 is a diagram schematically illustrating an electronic device having an image sensor based on some implementations of the disclosed technology.

FIG. 8 is a diagram schematically illustrating a camera system 900 having an image sensor 800 in accordance with an embodiment. Referring to FIG. 8, the camera system 900 having various image sensors 800 in accordance with the present embodiment may take a still image or moving image. The camera system 900 may include an optical lens system 910, a shutter unit 911, a driver 913 for controlling/driving the image sensor 800 and the shutter unit 911, and a signal processor 912. The camera system 900 may guide image light (incident light) Li from an object to the pixel array (refer to 810 of FIG. 1) of the image sensor 800. The optical lens system 910 may include a plurality of optical lenses. The shutter unit 911 may control a light irradiation period and shielding period for the image sensor 800. The driver 913 may control a transfer operation of the image sensor 800 and a shutter operation of the shutter unit 911. The signal processor 912 may perform various types of signal processing operations on a signal outputted from the image sensor 800. The processed image signal Dout may be stored in a storage medium such as a memory or outputted on a monitor or the like.

Although various embodiments have been described for illustrative purposes, it will be apparent to those skilled in the art that various changes and modifications may be made.

What is claimed is:

1. An image sensor comprising:
   a first active region including a first floating diffusion region, a first transistor active region including a first drive transistor and a first select transistor, and a first isolation structure for electrically isolating the first floating diffusion region from the first transistor active region,
   wherein the first isolation structure comprises a first P-typed doped region disposed on one corner of the first active region and a second P-typed doped region disposed in a center of the first active region, the first P-typed doped region and the second P-typed doped region being electrically coupled to each other and the first P-typed doped region including a contact structure configured to receive a ground voltage,
   wherein the first active region further comprises a first transfer transistor region disposed between the first floating diffusion region and the first P-typed doped region, and
   wherein a source region of the first select transistor is electrically isolated from the first transfer transistor region by the first P-typed doped region,
   wherein a protruding portion of the first floating diffusion region abuts receding portions extended from the first isolation structure, and
   wherein the receding portions extended from the first isolation structure include a first extension that is extended and disposed between the first floating diffusion region of the first active region and a drain region of the first drive transistor and between the first isolation structure and a drain region of the first drive transistor.

2. The image sensor of claim 1, wherein the first transistor active region further comprises:
   a channel region, a drain region, and a source region of the first drive transistor; and
   a channel region of the first select transistor.

3. The image sensor of claim 2, wherein the second P-typed doped region abuts the first floating diffusion region, the drain region and the source region of the first drive transistor, and the source region of the first select transistor.

4. The image sensor of claim 2, wherein the second P-typed doped region is surrounded by the first floating diffusion region, the channel region, the drain region and the source region of the first drive transistor, the channel region and the source region of the first select transistor, and the first P-typed doped region.

5. The image sensor of claim 2, wherein the first isolation structure further comprises a third P-type doped region which is electrically coupled to the second P-typed doped region, and
   the third P-type doped region is disposed between the first floating diffusion region and the first transistor active region.

6. The image sensor of claim 1, further comprising second to fourth active regions disposed in different locations relative to the first active region,
   wherein the second to fourth active regions includes, respectively, second to fourth floating diffusion regions, second to fourth transistor active regions, and second to fourth isolation structures for electrically isolating the second to fourth floating diffusion regions from corresponding transistor active regions.

7. The image sensor of claim 6, wherein one of the second and third transistor active regions of the second and third active regions comprise:
   a channel region, a drain region and a source region of a corresponding drive transistor; and
   a channel region and a source region of a corresponding select transistor.

8. The image sensor of claim 6, wherein one of the second and third isolation structures of the second and third active regions includes a doped region located relative to a corresponding floating diffusion region and abutting the corresponding floating diffusion region, a drain region and a source region of a corresponding drive transistor, and a source region of a corresponding select transistor.

9. The image sensor of claim 6, wherein one of the second and third isolation structures of the second and third active regions includes a doped region located relative to a corresponding floating diffusion region and surrounded by the corresponding floating diffusion region, a channel region, a drain region and a source region of a corresponding drive transistor, and a channel region and a source region of a corresponding select transistor.

10. The image sensor of claim 6, wherein the fourth transistor active region of the fourth active region comprises a channel region, a drain region and a source region of a reset transistor.

11. The image sensor of claim 10, wherein the fourth isolation structure of the fourth active region includes a fourth doped region located relative to a corresponding floating diffusion region and abutting the corresponding floating diffusion region and the drain region and the source region of the reset transistor.

12. The image sensor of claim 11, wherein the fourth doped region of the isolation structure of the fourth active region is surrounded by the corresponding floating diffusion region, the channel region, and the drain region and the source region of the reset transistor.

13. The image sensor of claim 1, wherein the first active region is surrounded and defined by a trench isolation structure.

14. An image sensor comprising:
first to fourth active regions comprising first to fourth floating diffusion regions, first to fourth transistor active regions, and first to fourth P-type isolation structures, the first to fourth floating diffusion region being electrically isolated from the first to fourth transistor active regions, respectively, by corresponding ones of the first to fourth P-type isolation structures,
wherein the first to third transistor active regions comprise first to third drive transistors and first to third select transistors, each drive transistor comprising a drain region and a source region and each select transistor comprising a source region, and
the fourth transistor active region comprises a drain region and a source region of a reset transistor, and
wherein the first to fourth P-type isolation structures include contact structures configured to receive a ground voltage,
wherein the first to third transistor active regions comprise first transfer transistor regions, respectively, the first transfer transistor regions disposed between one of the first to third floating diffusion regions and one of the first to third P-type isolation structures, and
wherein source regions of the first to third select transistors are electrically isolated from corresponding first transfer transistor regions, respectively, by corresponding ones of the first to third P-type isolation structures,
wherein first to fourth protruding portions of the first to fourth floating diffusion regions abut first to fourth receding portions extended from the first to fourth P-type isolation structures, and
wherein the first receding portion extended from the first P-type isolation structure includes a first extension that is extended and disposed between the first floating diffusion region of the first active region and the drain region of the first drive transistor and between the first isolation structure and the drain region of the first drive transistor,
wherein the second receding portion extended from the second P-type isolation structure includes a second extension that is extended and disposed between the second floating diffusion region of the second active region and the drain region of the second drive transistor and between the second isolation structure and the drain region of the second drive transistor,
wherein the third receding portion extended from the third P-type isolation structure includes a third extension that is extended and disposed between the third floating diffusion region of the third active region and the drain region of the third drive transistor and between the third isolation structure and the drain region of the third drive transistor, and wherein the fourth receding portion extended from the fourth P-type isolation structure includes a fourth extension that is extended and disposed between the fourth floating diffusion region of the fourth active region and the source region of the reset transistor and between the fourth isolation structure and the source region of the reset transistor.

15. The image sensor of claim 14, wherein one of the first to fourth P-type isolation structures comprise a first doped region disposed on one corner of a corresponding one of the first to fourth active regions and a second doped region disposed in a center of the corresponding one of the first to fourth active regions, the first doped region and the second doped region electrically coupled each other.

16. The image sensor of claim 15, wherein the first doped region of the one of the first to fourth P-type isolation structures abuts one of the source regions of corresponding ones of the first to third select transistors, and
the second doped region of the one of the first to fourth P-type isolation structure abuts the drain region of the reset transistor.

17. The image sensor of claim 15, wherein the one of the first to fourth P-type isolation structures further comprise a third doped region which abuts the second doped region of the center of the corresponding one of the first to fourth active regions and a corresponding side of the first to fourth active regions.

18. The image sensor of claim 17, wherein the third doped region is disposed between a corresponding one of the first to third floating diffusion regions and a drain region of a corresponding one of the first to third drive transistors, or
the third doped region is disposed between the fourth floating diffusion region and the source region of the reset transistor.

19. The image sensor of claim 14, wherein one of the first to third transistor active regions further comprise a channel region of a corresponding one of the first to third drive transistors and a channel region of a corresponding one of the first to third select transistors, and
the fourth transistor active region further comprises a channel region of the reset transistor.

20. An image sensor comprising:
first to fourth active regions comprising first to fourth floating diffusion regions, first to fourth transistor active regions, and first to fourth P-type isolation structures, the first to fourth floating diffusion region being electrically isolated from the first to fourth transistor active regions, respectively, by corresponding ones of the first to fourth P-type isolation structures,
wherein the first to third transistor active regions comprise first to third drive transistors and first to third select transistors, each drive transistor comprising a drain region and a source region and each select transistor comprising a source region,
wherein the fourth transistor active region comprises a drain region and a source region of a reset transistor, and
wherein the first to fourth P-type isolation structures include contact structures configured to receive a ground voltage,
wherein the first to third transistor active regions comprise first transfer transistor regions, respectively, the first transfer transistor regions disposed between one of the first to third floating diffusion regions and one of the first to third P-type isolation structures,
wherein source regions of the first to third select transistors are electrically isolated from corresponding first transfer transistor regions, respectively, by corresponding ones of the first to third P-type isolation structures,
wherein one of the first to third transistor active regions further comprise a channel region of a corresponding one of the first to third drive transistors and a channel region of a corresponding one of the first to third select transistors, and wherein the fourth transistor active region further comprises a channel region of the reset transistor, wherein the channel region of the corresponding one of the first to third drive transistors, the channel region of the corresponding one of the first to third select transistors, and a corresponding one of the first to third floating diffusion regions are disposed on corners of the one of the first to third active regions, respectively, and the channel region and the drain region of the reset transistor and the fourth floating diffusion region are disposed on corners of the fourth active region, respectively.

* * * * *